(12) United States Patent
Gorshkov et al.

(10) Patent No.: US 11,562,049 B2
(45) Date of Patent: Jan. 24, 2023

(54) HEISENBERG SCALER

(71) Applicant: Government of the United States of America, as represented by the Secretary of Commerce, Gaithersburg, MD (US)

(72) Inventors: Alexey Vyacheslavovich Gorshkov, Rockville, MD (US); James Vincent Porto, III, Arlington, VA (US); Kevin Chengming Qian, Rockville, MD (US); Zachary David Eldredge, Washington, DC (US); Wenchao Ge, College Station, TX (US); Guido Pagano, Washington, DC (US); Christopher Roy Monroe, Ellicott City, MD (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 697 days.

(21) Appl. No.: 16/677,922

(22) Filed: Nov. 8, 2019

(65) Prior Publication Data
US 2020/0201933 A1 Jun. 25, 2020

Related U.S. Application Data

(60) Provisional application No. 62/758,333, filed on Nov. 9, 2018.

(51) Int. Cl.
*G06F 17/17* (2006.01)
*G01N 24/00* (2006.01)
*G06N 10/00* (2022.01)

(52) U.S. Cl.
CPC .......... *G06F 17/17* (2013.01); *G01N 24/008* (2013.01); *G06N 10/00* (2019.01)

(58) Field of Classification Search
CPC ...... G06F 17/17; G01N 24/008; G01N 24/00; G06N 10/00
(Continued)

(56) References Cited

U.S. PATENT DOCUMENTS 10,007,885 B1  6/2018  Gorshkov et al.

OTHER PUBLICATIONS

Eldredge, Z., et al., "Optimal and secure measurement protocols quantum sensor networks", Physical Review, 2018, p. 042337, vol. 97.
(Continued)

*Primary Examiner* — Tan V Mai
(74) *Attorney, Agent, or Firm* — Office of Chief Counsel for National Institute of Standards and Technology

(57) ABSTRACT

A Heisenberg scaler reduces noise in quantum metrology and includes: a stimulus source that provides physical stimuli; a physical system including quantum sensors that receive a first and second physical stimuli; produces a measured action parameter; receives an perturbation pulse; and produces modal amplitude; an estimation machine that: receives the measured action parameter and produces a zeroth-order value from the measured action parameter; a gradient analyzer that: receives the measured action parameter and produces the measured action parameter and a gradient; the sensor interrogation unit that: receives the modal amplitude; receives the gradient and the measured action parameter; produces the perturbation pulse; and produces a first-order value from the modal amplitude, the gradient, and the measured action parameter; a Heisenberg determination machine that: receives the zeroth-order value; receives the first-order value; and produces a physical scalar from the zeroth-order value and the first-order value.

2 Claims, 20 Drawing Sheets

(58) Field of Classification Search
USPC .......................................................... 708/200
See application file for complete search history.

(56) References Cited

OTHER PUBLICATIONS

Proctor, T.J., et al., "Multiparameter estimation in networked quantum sensors", Physical Review Letters, 2018, p. 080501, vol. 120.
Proctor, T.J., et al., "Supplementary material for: Multiparameter estimation in networked quantum sensors", Physical Review Letters, 2018.
Zhuang, Q., et al., "Distributed quantum sensing using continuous-variable multipartite entanglement", Physical Review, 2018, p. 032329, vol. 97.

(A)

(B)

HEISENBERG SCALER

CROSS REFERENCE TO RELATED APPLICATIONS

The application claims priority to U.S. Provisional Patent Application Ser. No. 62/758,333 filed Nov. 9, 2018, the disclosure of which is incorporated herein by reference in its entirety.

STATEMENT REGARDING FEDERALLY SPONSORED RESEARCH

This invention was made with United States Government support from the National Institute of Standards and Technology (NIST), an agency of the United States Department of Commerce and under Agreement No. W911NF1520067 awarded by the Army Research Lab, Agreement No. W911NF1410599 awarded by the Army Research Office, and Agreement No. W911NF16-1-0082 awarded by the Intelligence Advanced Research Projects Activity (IARPA). The Government has certain rights in the invention. Licensing inquiries may be directed to the Technology Partnerships Office, NIST, Gaithersburg, Md., 20899; voice (301) 301-975-2573; email tpo@nist.gov; reference NIST.

BRIEF DESCRIPTION

Disclosed is a process for determining a physical scalar of an arbitrary response function, the process comprising: providing the arbitrary response function that comprises a plurality of action parameters $\theta_i$; subjecting a physical system that comprises a plurality of quantum sensors to a physical stimulus; producing, for an action parameter of each quantum sensors, in response to subjecting the quantum sensors to the physical stimulus, a measured action parameter to provide a plurality of measured action parameters for the physical system; producing a zeroth-order value of the arbitrary response function by evaluating the arbitrary response function at the measured action parameters; determining the gradient of the arbitrary response function at the measured action parameters; producing an perturbation pulse; subjecting the physical system to the perturbation pulse; producing, in response to the perturbation pulse, modal amplitude comprising a measured value of a dot product of the gradient and a vector of action parameters $\theta_i$; producing a first-order value of the arbitrary response function by subtracting from modal amplitude the dot product of the gradient and the vector of measured action parameter; and adding the zeroth-order value and the first-order value to determine the physical scalar of the arbitrary response function.

Disclosed is a Heisenberg scaler for reducing noise in quantum metrology, the Heisenberg scaler comprising: a stimulus source that provides a first physical stimulus and a second physical stimulus; a physical system in communication with the stimulus source and comprising a plurality of quantum sensors and that: receives the first physical stimulus and the second physical stimulus from the stimulus source; produces measured action parameter in response to receipt of the first physical stimulus; receives an perturbation pulse from a sensor interrogation unit; produces modal amplitude; an estimation machine in communication with the physical system and that: receives the measured action parameter from the physical system; and produces a zeroth-order value from the measured action parameter; a gradient analyzer in communication with the physical system and the sensor interrogation unit and that: receives the measured action parameter from the physical system; and produces the measured action parameter and a gradient from the measured action parameter; the sensor interrogation unit in communication with the physical system and the gradient analyzer and that: receives the modal amplitude from the physical system; receives the gradient and the measured action parameter from the gradient analyzer; produces the perturbation pulse; and produces a first-order value from the modal amplitude, the gradient, and the measured action parameter; a Heisenberg determination machine in communication with the estimation machine and the sensor interrogation unit and that: receives the zeroth-order value from the estimation machine; receives the first-order value from the sensor interrogation unit; and produces a physical scalar from the zeroth-order value and the first-order value.

BRIEF DESCRIPTION OF THE DRAWINGS

The following description should not be considered limiting in any way. With reference to the accompanying drawings, like elements are numbered alike.

DETAILED DESCRIPTION

Figure 1:
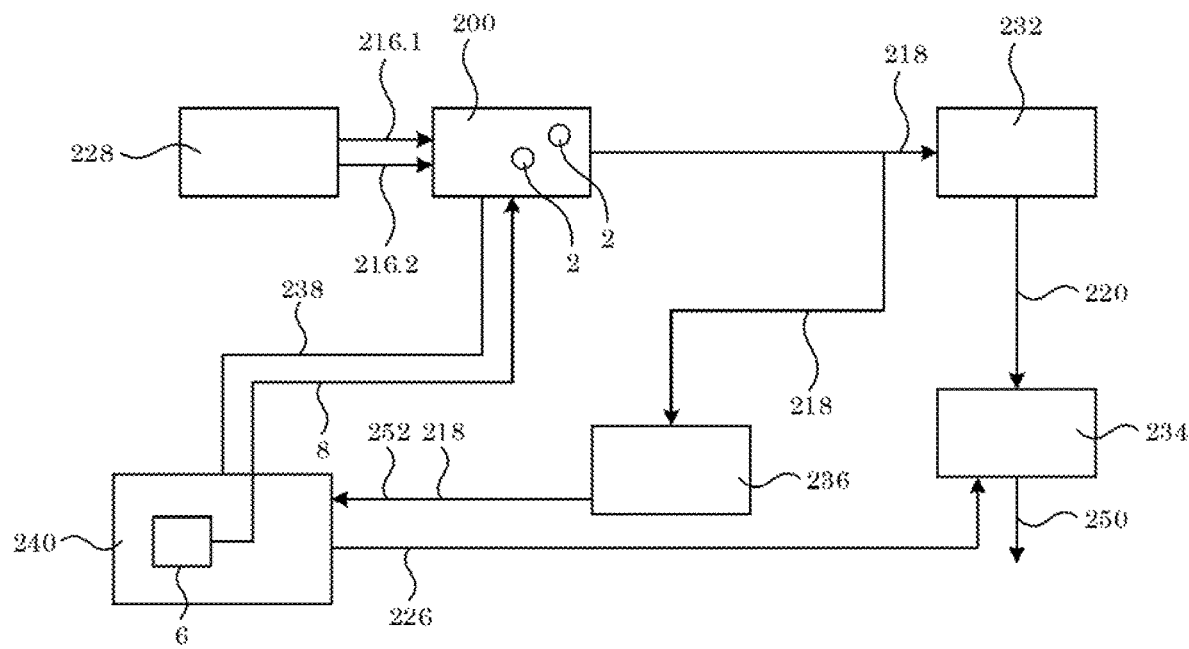
FIG. 1 shows a Heisenberg scaler.
Figure 2:
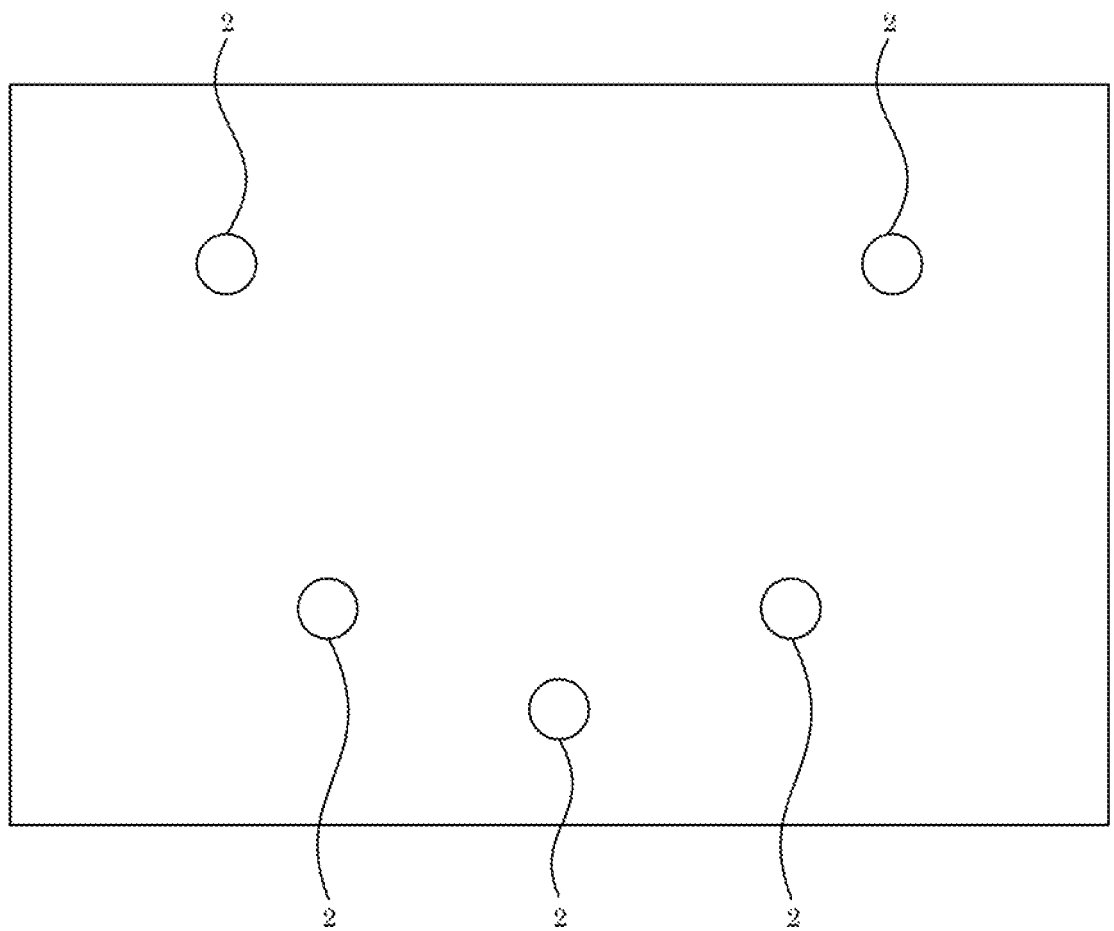
FIG. 2 shows a physical system.
Figure 3:
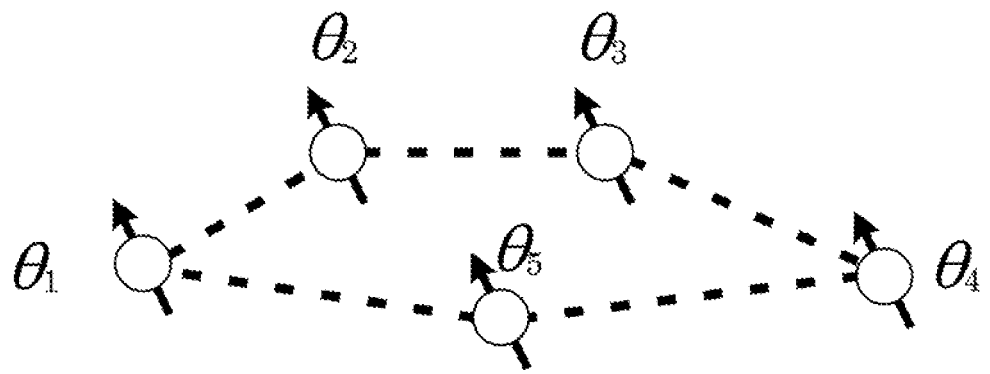
FIG. 3 shows a physical system including a quantum sensor network of spatially separated nodes, wherein at each node, action parameter $\theta_i$ is coupled to a qubit that accumulates phase proportional to $\theta_i$.

A detailed description of one or more embodiments is presented herein by way of exemplification and not limitation.

It has been discovered that a Heisenberg scaler and processes herein optimally include quantum entanglement in a network of quantum sensors to optimally measure a smooth function of fields at the quantum sensors. It is contemplated that in applications for geodesy, geophysics, biology, medicine, and the like, wherein sensors can be separated by a selected distance to measure temperature, a field (e.g., magnetic field, electric field, or a combination thereof), pressure, and the like, the Heisenberg scaler and processes apply when the fields at the sensors are different such as a sensor that measures electric field and another sensor that measures temperature. The process and Heisenberg scaler can include an array of interferometers, and an array of field-quadrature displacement sensors, measuring functions of parameters some of which are measured by sensors, while others are measured by interferometers, while others are measured by field-quadrature displacement sensors, and the like.

Fields at individual sensors or phases of individual interferometers or field-quadrature displacements are measured without entanglement between sensors or interferometers or field-quadrature displacement sensors to a precision sufficient for linearization of a function. The resulting linearized function is measured optimally by distributing a selected entangled state across the network of sensors or interferometers or field-quadrature displacement sensors. For qubits, a first step of entanglement-free measurements can be done in a time proportional to $T^{(3/5)}$, where T is the total available time, and the fraction of time spent on this first step vanishes as T becomes longer and longer. Thus, time is spent on the optimal measurement of the linearized function. For interferometers and field-quadrature displacement sensors, a first step of entanglement-free measurements can be done with a number of photons proportional to $m^{(3/5)}$, where m is the total number of photons available for the measurement, and the faction of photons used in this first step vanishes as m becomes larger and larger. The photons are spent on the optimal measurement of the linearized function.

Advantageously, the process and Heisenberg scaler use entanglement to optimally measure linear combinations of fields at the N sensors (qubit sensors, interferometers, or field-quadrature displacement sensors) and measure arbitrary smooth functions so that, for qubit sensors, a desired measurement is performed at a Sqrt[N] times faster than an entanglement-free methodology, and so that, for interferometers and field-quadrature displacement sensors, the desired measurement is performed by a number of photons that is Sqrt[N] times smaller than an entanglement-free methodology. Reducing the required number of photons is particularly relevant when analyzing a biological or chemical sample that is sensitive to light, making it desirable to reduce noise with as few photons as possible. For a fixed time, in the case of sensors or for a fixed number of photons in the case of interferometers and field-quadrature displacement sensors, a measurement uncertainty is Sqrt[N] times smaller than an entanglement-free methodology. Beneficially, the process and Heisenberg scaler measures properties of inhomogeneous fields and functions that depend on a measurable quantity.

Heisenberg scaler 300 reduces noise in quantum metrology and determines physical scalar 250 of arbitrary response function 210. In an embodiment, with reference to FIG. 1, FIG. 2, FIG. 3, and FIG. 4, Heisenberg scaler 300 includes: stimulus source 228 that provides first physical stimulus 216.1 and second physical stimulus 216.2; physical system 200 in communication with stimulus source 228 and including a plurality of quantum sensors 2 and that: receives first physical stimulus 216.1 and second physical stimulus 216.2 from stimulus source 228; produces measured action parameter 218 in response to receipt of first physical stimulus 216.1; receives perturbation pulse 8 from sensor interrogation unit 240; produces modal amplitude 238; estimation machine 232 in communication with physical system 200 and that: receives measured action parameter 218 from physical system 200; and produces zeroth-order value 220 from measured action parameter 218; gradient analyzer 236 in communication with physical system 200 and sensor interrogation unit 240 and that: receives measured action parameter 218 from physical system 200; and produces measured action parameter 218 and gradient 252 from measured action parameter 218; sensor interrogation unit 240 in communication with physical system 200 and gradient analyzer 236 and that: receives modal amplitude 238 from physical system 200; receives gradient 252 and measured action parameter 218 from gradient analyzer 236; produces perturbation pulse 8; and produces first-order value 226 from modal amplitude 238, gradient 252, and measured action parameter 218; and Heisenberg determination machine 234 in communication with estimation machine 232 and sensor interrogation unit 240 and that: receives zeroth-order value 220 from estimation machine 232; receives zeroth-order value 220 from estimation machine 232; receives first-order value 226 from sensor interrogation unit 240; and produces physical scalar 250 from zeroth-order value 220 and first-order value 226.

Stimulus source 228 can include a pulse source that provides electromagnetic radiation having a frequency near resonance with the qubit sensor. Exemplary stimulus sources 228 include pulse sources (such as lasers) of optical frequencies for optical qubits, pulse sources of microwave frequencies for microwave qubits, and pulse sources of radiofrequencies for radiofrequency qubits. In the case of interferometers, stimulus source 228 is a source of photons, wherein the photons are communicated to the interferometer to determine the phases θi. In the case of field-quadrature displacement sensors, the stimulus source 228 is a source of squeezed light that is sent to each displacement sensor in order to measure the displacements θi.

Stimulus source 228 produces physical stimulus 216 that can include a pulse of electromaimetic radiation having a frequency near resonance with the qubit sensor. Exemplary physical stimuli 216 include optical pulses (such as laser pulses) for optical qubits, microwave pulses for microwave qubits, and radiofrequency pulse for radiofrequency qubits. A power of physical stimulus 216 can be chosen to implement a pi-over-2 pulse on the qubit sensor. As used herein, "power" refers to the area of the pulse, which includes both the time and the intensity. It is contemplated that physical system 200 is subjected to first physical stimulus 216.1 and subsequently to second physical stimulus 216.2. In this regard first physical stimulus 216.1 changes the quantum state of a qubit sensor from initial state |0> to final state (|0>+|1>)/Sqrt[2]. First physical stimulus 216.1 can include a pi-over-2 pulse of electromagnetic radiation. Further, second physical stimulus 216.2 can be a pi-over-2 pulse on a qubit sensor that maps the phase picked by the qubit on a population difference between |0> and |1>, which can then be projectively measured by, for example, scattering photons and observing fluorescence. In the case of interferometers, physical stimulus 216 is a photonic state sent to the interferometer in order to determine the phases $\theta_i$. The n photons are prepared in state (|n,0>+|0,n>)/sqrt[2], where the first entry denotes the mode that picks up the phase $\theta_i$, while the second entry denotes the reference mode that picks up no phase. In the case of field-quadrature displacement sensors, physical stimulus 216 is squeezed state of light that is sent to each displacement sensor in order to measure the displacements $\theta_i$. The light is squeezed in the quadrature that is being displaced.

Physical system 200 can include an array or network of qubit sensors, an array or network of interferometers, an array of network of field-quadrature displacement sensors, or a combination thereof.

Physical system 200 includes a plurality of quantum sensors 2 that can include a two-level quantum system such as provided by qubits, a three-level quantum system such as provided by qutrits, a four-level quantum system, . . . , an m-level quantum system and the like, wherein m is an integer. It is contemplated that energy differences are measured between two levels so certain embodiments are described in the context of qubits. Exemplary quantum sensors 2 include a nuclear spin, an electronic spin, any two chosen levels of a neutral atom, an ion, a molecule, a solid-state defect, a superconducting qubit, and the like. In an embodiment, quantum sensors 2 include a neutral atom, an ion, a molecule, a solid-state defect (such as color center in diamond), a superconducting circuit, and the like, or a combination thereof. The energy differences $\theta_i$ between the two levels of each qubit sensor can depend linearly on an observable of interest such as an electric field, a magnetic field, a gravitational field, temperature, strain, and the like. These observables of interest can be produced by an analyte that can include a planet, an organism (e.g. a human), an organ (e.g, a brain or a heart), a tissue (e.g., cardiac tissue), a laser, a molecule (e.g. including macromolecule such as a protein or a nucleic acid), an atom, and the like. In the case of interferometers, the quantum sensor 2 is the interferometer including a path that goes through the medium of interest and picks up a phase $\theta_i$ and a reference path that doesn't pick up a phase. The medium of interest can include a tissue, a cell, or any other medium that transmits light. In the case of field-quadrature displacement sensors, quantum sensors 2 can include a bosonic mode that undergoes a field-quadrature displacement $\theta_i$ and a homodyne detector used to measure this field quadrature. The bosonic mode can describe mechanical motion where $\theta_i$ can be proportional to a force. The bosonic mode can describe photons where $\theta_i$ can be proportional to a magnetic field via Faraday-rotation after passing through the medium. The bosonic mode can describe low-energy excitations of a large number of two-level atoms where $\theta_i$ can be proportional to an applied electric or magnetic field.

Physical system 200 produces measured action parameter 218 that can include estimates of action parameters $\theta_i$ 212. For qubit sensors, measured action parameter 218 can include estimates of energy differences between the two levels of the qubit. For interferometers, measured action parameter 218 can include estimates of phases in the arms of the interferometers. For field-quadrature displacement sensors, measured action parameter 218 can include estimates of the displacements.

Estimation machine 232 receives measured action parameter 218, and estimation machine 232 can include a classical computer that evaluates the desired arbitrary response function 210 f($\theta_1$, . . . , $\theta_N$) at the measured action parameter 218. Estimation machine 232 produces zeroth-order value 220 that can include the desired arbitrary response function 210 f($\theta_1$, . . . , $\theta_N$) evaluated at the measured action parameter 218.

Gradient analyzer 236 receives measured action parameter 218, and gradient analyzer 236 can include a classical computer that evaluates the gradient $\nabla f$ of the desired arbitrary response function 210 f at the measured action parameter 218. Gradient analyzer 236 produces measured action parameter 218, as well as the gradient 252 that is the gradient $\nabla f(\{\tilde{\theta}_i\})$ of the desired arbitrary response function 210 f evaluated at the measured action parameter 218 $\tilde{\theta}_i$.

Sensor interrogation unit 240 receives the measured action parameter 218 and gradient 252, and sensor interrogation unit 240 can include a pulse source 6, which produces perturbation pulse 8 in the form of pulses to control the sensor qubits. Exemplary sensor interrogation units 240 include pulse sources (such as lasers) of optical frequencies for optical qubits, pulse sources of microwave frequencies for microwave qubits, and pulse sources of radiofrequencies for radiofrequency qubits. For interferometers, the pulse source is a source of entangled photons that are sent to the interferometers in order to measure the quantity $\nabla f(\{\tilde{\theta}_i\}) \cdot \vec{\theta}$. For field-quadrature displacement sensors, the pulse source is a source of multimode entangled squeezed light that is sent to the displacement sensors in order to measure the quantity $\nabla f(\{\tilde{\theta}_i\}) \cdot \vec{\theta}$.

Sensor interrogation unit 240 produces perturbation pulse 8 that can include optical pulses (such as laser pulses) for optical qubits, microwave pulses for microwave qubits, and radiofrequency pulse for radiofrequency qubits. Exemplary perturbation pulse 8 includes pulses that entangle qubits into the initial state (|00 . . . 0>+|11 . . . 1>)/Sqrt[2] via phonon-mediated interactions, electric interactions, magnetic interactions, or interactions mediated by flying photonic qubits. Moreover, while this entangled state of qubits is picking up phases proportional to $\theta_1$, exemplary perturbation pulse 8 includes pulses that are used to control this entangled state of qubits in such a way that the picked up phase is proportional to $\nabla f(\{\tilde{\theta}_i\}) \cdot \vec{\theta}$, which is the dot product of the gradient 252 and the vector of $\theta_i$. In the case of interferometers, the perturbation pulse 8 includes the multimode entangled photonic state (|n1,0,n2,0, . . . >+|0,n1,0,n2, . . . >)/sqrt[2], where, in the reference to FIG. 4, the modes are listed from top to bottom and where nj=n*aj/(sum_k a_k), where a_k is the k'th component of $\nabla f(\{\tilde{\theta}_i\})$ and where n is the total number of photons we have at our disposal. In the case of a combination of qubits and interferometers, the entangled state to be used is an entangled state of photons and qubits of the form (|n1,0,n2,0, . . . > |111 . . . >+|0,n1,0,n2, . . . >|000 . . . >)/sqrt[2].

Sensor interrogation unit 240 receives modal amplitude 238 that can include the measured value of $\nabla f(\{\tilde{\theta}_i\}) \cdot \vec{\theta}$, which is the dot product of the gradient 252 and the vector of θi.

Sensor interrogation unit 240 produces first-order value 226 that can include the difference between the modal amplitude 238, i.e. $\nabla f(\{\tilde{\theta}_i\}) \cdot \vec{\theta}$, and $\nabla f(\{\tilde{\theta}_i\}) \cdot (\tilde{\theta}_1, \tilde{\theta}_2, \ldots, \tilde{\theta}_N)$, which is the dot product of gradient 252 and the vector of measured action parameter 218 $\tilde{\theta}_i$.

Heisenberg determination machine 234 receives first-order value 226 and zeroth-order value 220, and Heisenberg determination machine 234 can include a classical computer that adds the first-order value 226 and zeroth-order value 220 to produce the physical scalar 250.

Heisenberg determination machine 234 produces physical scalar 250 that can include the sum of the first-order value 226 and the zeroth-order value 220.

Physical scalar 250 is determined for arbitrary response function 210 of quantum sensors 2 in physical system 200. Arbitrary response function 210 can include an arbitrary analytic function f of θi. Exemplary arbitrary response functions 210 include (1) an arbitrary implicit function, which is a solution to some equation that has no closed form solution that can be easily evaluated, (2) a function obtained by assuming that θi have some functional form that depends on certain tunable ansatz parameters and the position of the sensor (which could be qubit sensor, an interferometer, or a displacement sensor), and then using interpolation to express the value of this function at a position where there is no sensor in terms of its values θi at the positions of the sensors, (3) a function obtained by assuming that θi have some functional form that depends on certain tunable ansatz parameters and the position of the sensor, and inverting this function to solve for one of the ansatz parameters in terms of θi, (4) a function obtained by running supervised machine learning on training data consisting of input-output pairs, (5) a function obtained by using interpolation to infer the intensity of a laser beam at the position of a trapped data ion based on the intensities of the laser beam at the positions of trapped sensor ions, and the like.

Heisenberg scaler 300 can be made in various ways. In an embodiment, a process for making Heisenberg scaler 300 includes: disposing physical system 200 in communication with stimulus source 228; disposing parameter analysis machine 230 in communication with physical system 200; disposing estimation machine 232 in communication with parameter analysis machine 230; disposing gradient analyzer 236 in communication with parameter analysis machine 230 disposing sensor interrogation unit 240 in communication with gradient analyzer 236; disposing sensor interrogation unit 240 in communication with physical system 200; disposing Heisenberg determination machine 234 in communication with estimation machine 232; and disposing Heisenberg determination machine 234 in communication with sensor interrogation unit 240.

Heisenberg scaler 300 has numerous advantageous and unexpected benefits and uses. In an embodiment, a process for determining physical scalar 250 of arbitrary response function 210 includes: providing arbitrary response function 210 that includes a plurality of action parameters θi 212 by explicitly giving the mathematical formula for the function or by specifying the function implicitly as a solution to some set of equations; subjecting physical system 200 that includes a plurality of quantum sensors 2 to physical stimulus 216; producing a plurality of measured action parameters 218 for physical system 200 in response to subjecting the quantum sensors 2 to the physical stimulus 216; producing zeroth-order value 220 of arbitrary response function 210 by evaluating arbitrary response function 210 at measured action parameters 218; producing the gradient 252 that is the gradient of arbitrary response function 210 evaluated at the measured action parameter 218; producing the modal amplitude 238 for physical system 200 in response to subjecting the quantum sensors 2 to the perturbation pulse 8; producing the first-order value 226 from modal amplitude 238, gradient 252, and measured action parameter 218; and combining zeroth-order value 220 and first-order value 226 to determine physical scalar 250 of arbitrary response function 210.

The process for determining physical scalar 250 of arbitrary response function 210 also can include producing perturbation pulse 8; subjecting physical system 200 to perturbation pulse 8; and producing modal amplitude 238 in response to perturbation pulse 8.

Figure 6:
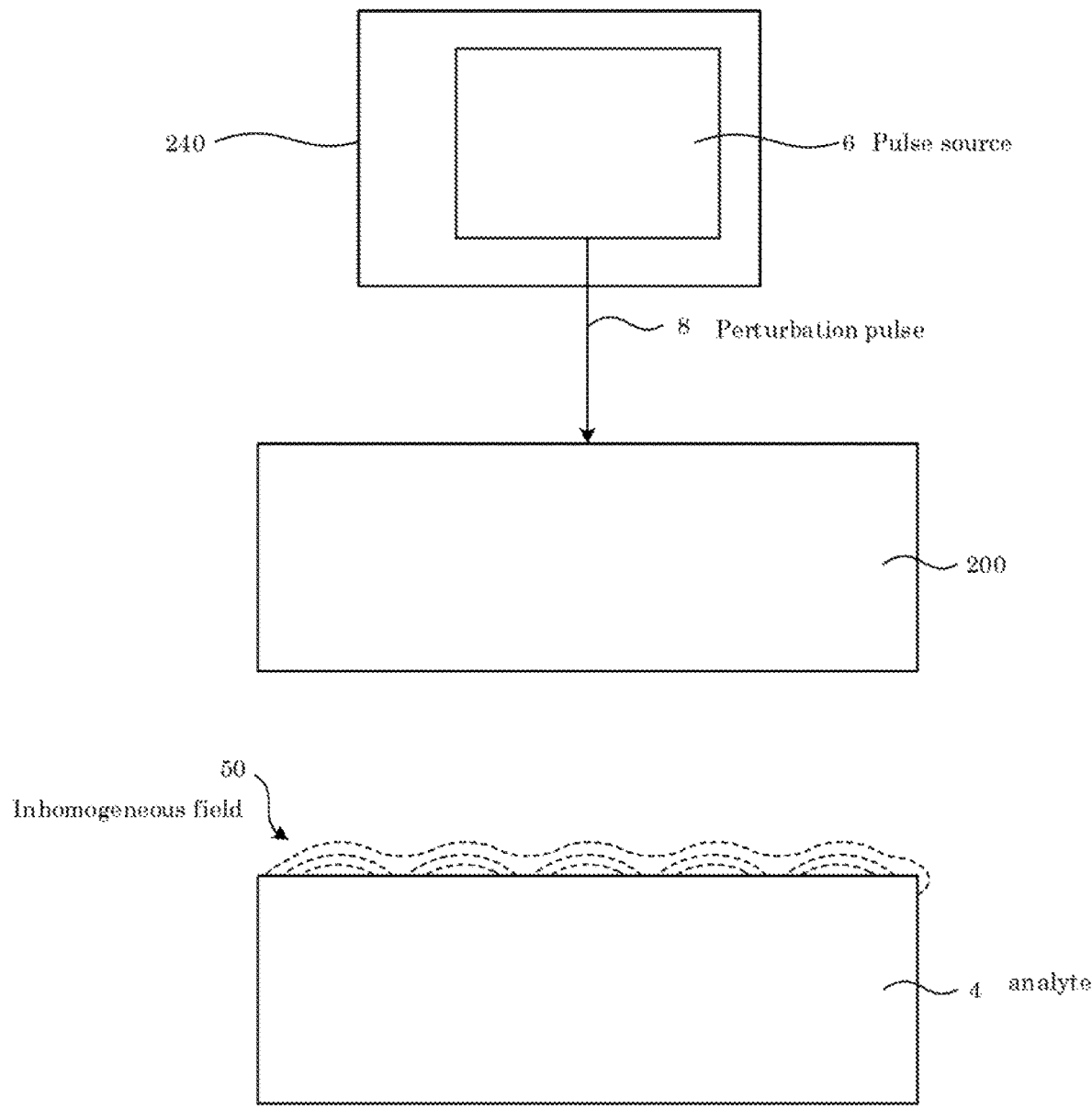
FIG. 6 shows a system for determining a modal amplitude of an inhomogeneous field of an analyte.

In an embodiment, with reference to FIG. 6, physical system 200 is disposed proximate to analyte 4 such that physical system 200 is subjected to inhomogeneous field 50 of analyte 4. Additionally, sensor interrogation unit 240 includes pulse source 6 that provides perturbation pulse 8 to physical system 200. Physical system 200 determines modal amplitude q of inhomogeneous field 50 of analyte 4 in response to receipt of perturbation pulse 8.

Figure 7:
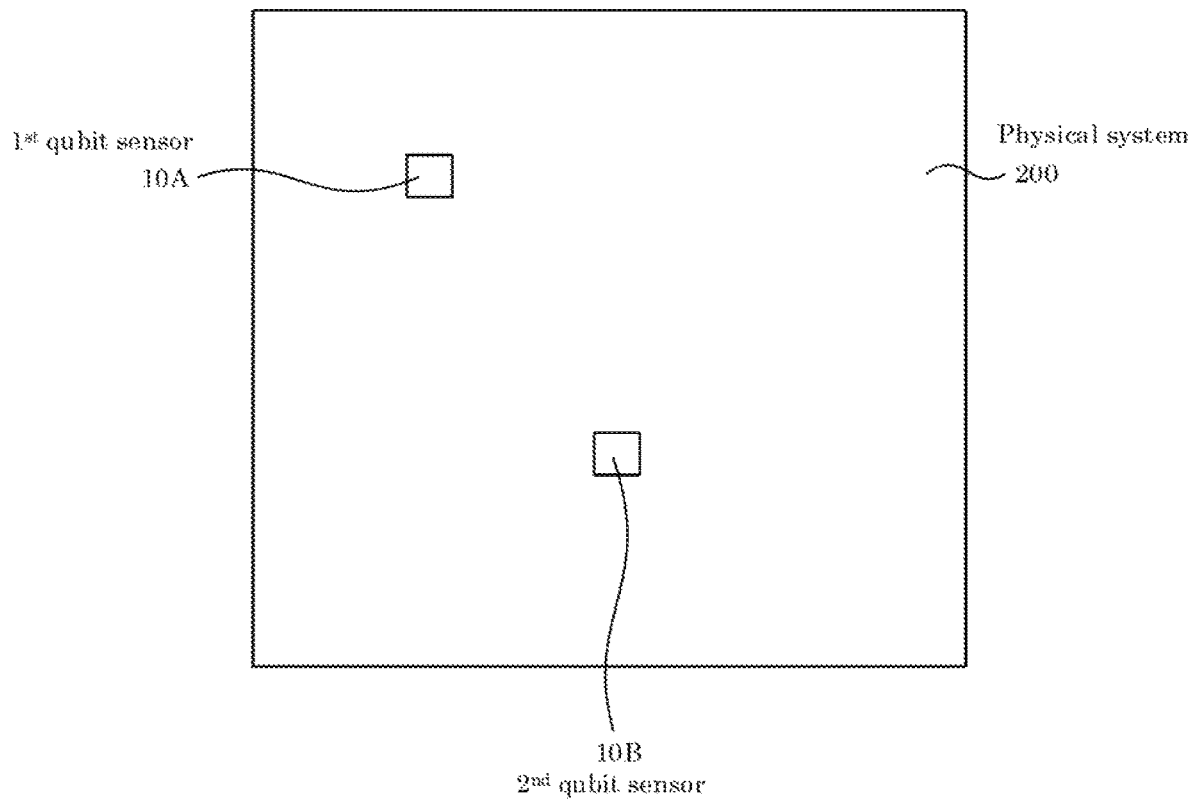
FIG. 7 shows a quantum sensor.
Figure 7:
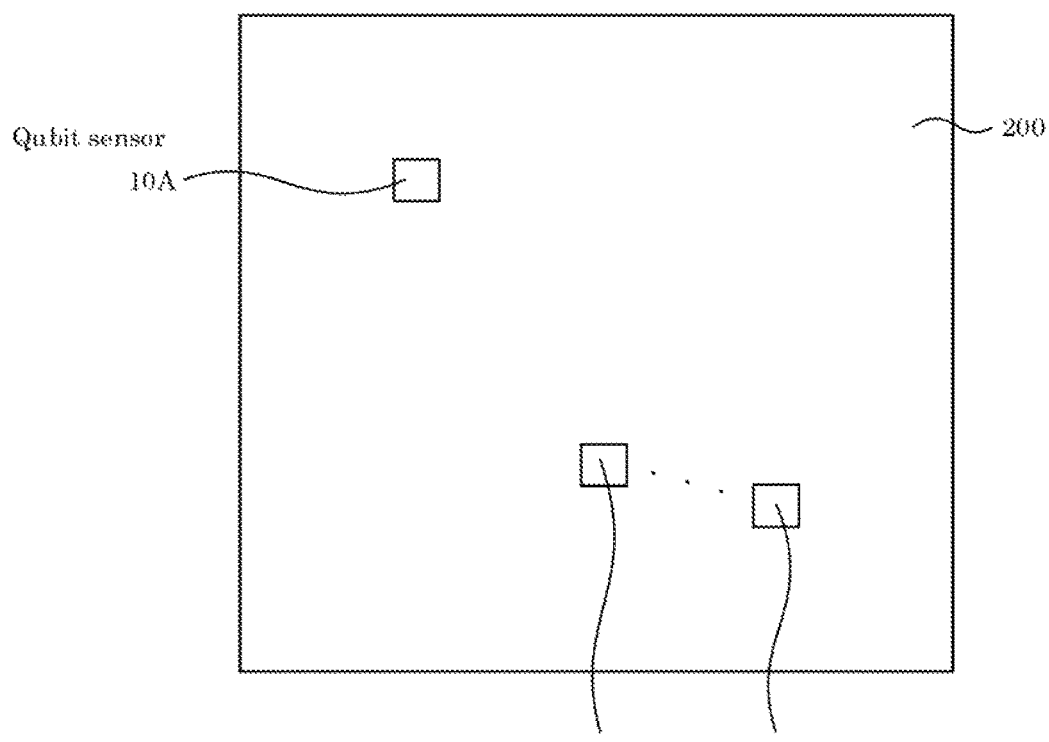

In an embodiment, as shown in panel A of FIG. 7, physical system 200 includes a plurality of qudit sensors, e.g., first qudit sensor 10A and second qudit sensor 10B. It is contemplated that physical system 200 can include an arbitrary number N of qudit sensors as shown in panel B of FIG. 7.

Figure 8:
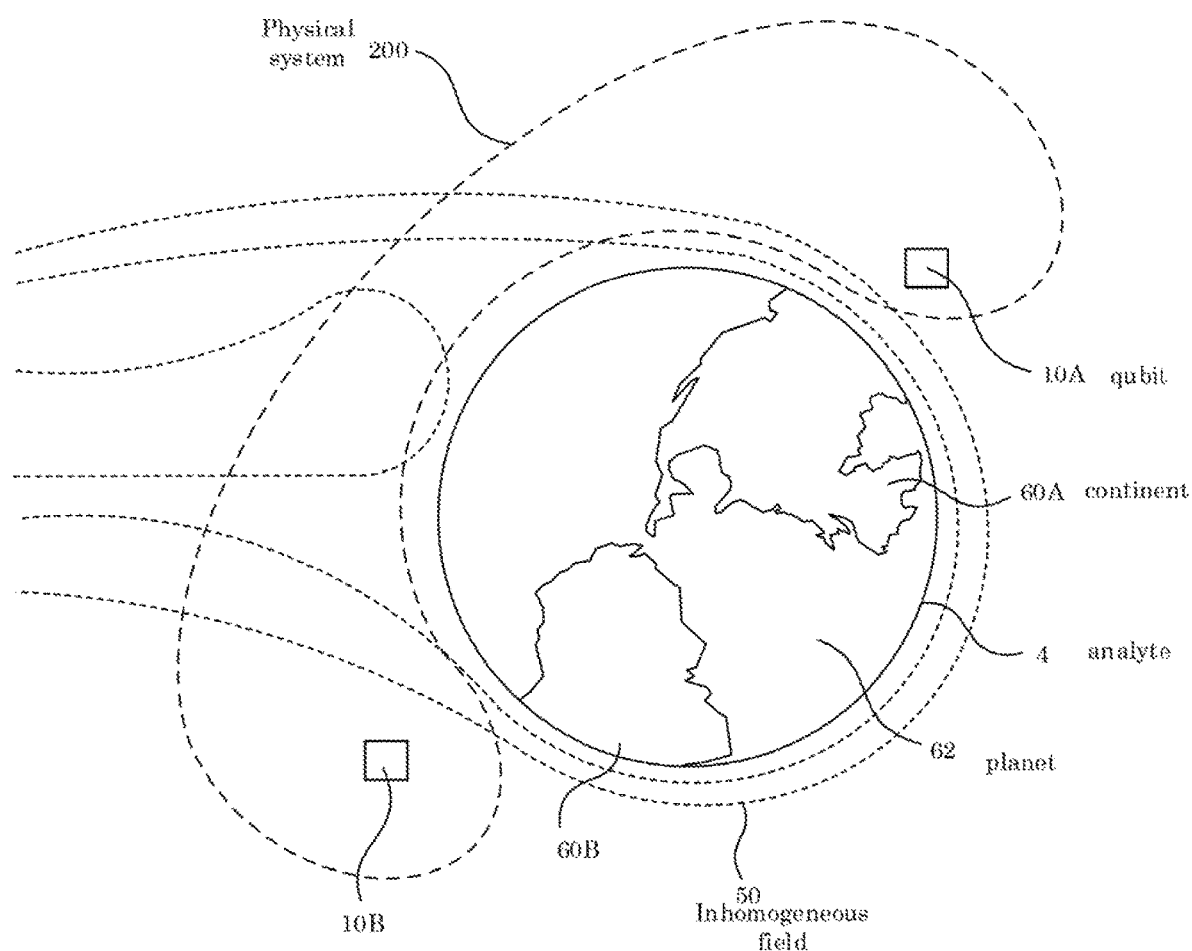
FIG. 8 shows a system for determining a modal amplitude of an inhomogeneous field of an analyte.

In a particular embodiment, with reference to FIG. 8, analyte 4 can be planet 62 that includes a plurality of continents 60 (e.g., first continents 60A, second continents 60B), wherein planet 62 has inhomogeneous field 50, e.g., an inhomogeneous magnetosphere. Physical system 200 is disposed proximate to planet 62 in a presence of inhomogeneous field 50 such that qudit sensors 10 (e.g., 10A, 10B) are subjected to inhomogeneous field 50, here the inhomogeneous magnetosphere. Further, pulse source 6 (not shown) provides perturbation pulse 8 (not shown) to qudit sensors 10 (10A, 10B). As a result, sensor interrogation unit 240 determines the modal amplitude q of inhomogeneous field 50 of planet 62.

Figure 9:
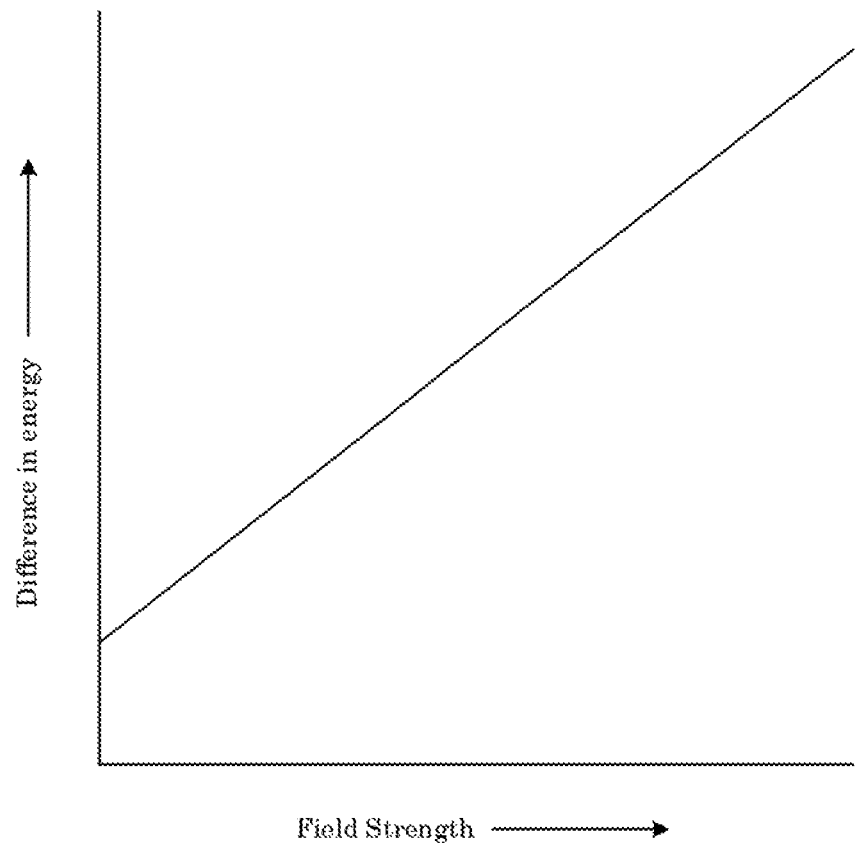
FIG. 9 shows a graph of difference in energy versus field strength.

In physical system 200, first qudit sensor 10A includes a plurality of quantum levels that are subject to entanglement with a plurality of quantum levels of second qudit sensor 10B to provide an initial entangled state of physical system 200. The initial entangled state includes a first quantum level, a second quantum level, and an energy difference between the second quantum level and the first quantum level. Here, the energy difference between the first quantum level and the second quantum level of the initial entangled state is linearly dependent on a strength of inhomogeneous field 50 as shown in FIG. 9. Moreover, the initial entangled state is an initial linear superposition of the first quantum level and the second quantum level.

Qudit sensor 10 can be a two-level quantum system such as provided by qubits, a three-level quantum system such as provided by qutrits, a four-level quantum system, . . . , an m-level quantum system, and the like, wherein m is an integer. Accordingly, qudit sensor 10 can include a qubit, qutrit, a quartit, and the like, or a combination of such qudits.

Exemplary qubits include a nuclear spin-1/2, an electronic spin-1/2, or any two chosen levels of a neutral atom, an ion, a molecule, a solid-state defect, a superconducting circuit, and the like. Exemplary qutrits include a spin-1 particle or any three chosen levels of a neutral atom, an ion, a molecule, a solid-state defect, a superconducting circuit, and the like. In an embodiment, qudit sensor 10 include a neutral atom, an ion, a molecule, a solid-state detect (such as a nitrogen vacancy color center in diamond), a superconducting circuit, and the like, or a combination.

In an embodiment, first qudit sensor 10A is a qubit, and second qudit sensor 10B is a qubit. In an embodiment, first qudit sensor 10A is a qutrit, and second qudit sensor 10B is a qutrit. In an embodiment, first qudit sensor 10A is a qubit, and second qudit sensor 10B is a qutrit.

It is contemplated that qudit sensors 10 can be included in, physical system 200 as a monolithic device, wherein physical system 200 can include the substrate in which qudit sensors 10 are disposed and arranged. Here, qudit sensors 10 are in mechanical communication via phonons in the substrate or interact via electric or magnetic interactions. Qudit sensors 10 alternatively can be arranged in a network such that the plurality of qudit sensors 10 are subject to quantum entanglement using flying photonic qubits.

It is contemplated that the initial entangled state of physical system 200 can be changed to an intermediate entangled state or final entangled state in response to receipt of perturbation pulse 8 by physical system 200. In an embodiment, sensors 10 include first qutrit 10A and second qutrit 10B, wherein the initial entangled state is the first linear superposition $$\frac{1}{\sqrt{2}}[|00\rangle + |11\rangle],$$

which then evolves under the coupling to the inhomogeneous field to $$\frac{1}{\sqrt{2}}[|00\rangle + e^{-i\vartheta_1}|11\rangle]$$

for some phase $\theta_1$ and the final entangled state is final linear superposition $$\frac{1}{\sqrt{2}}[|00\rangle + e^{-i\vartheta_1}|21\rangle]$$

which then also evolves under the coupling to the inhomogeneous field to $$\frac{1}{\sqrt{2}}[|00\rangle + e^{-it_f q}|11\rangle].$$

Here ket $|00\rangle$ refers to both qutrits in state $|0\rangle$; ket $|11\rangle$ refers to both qutrits in state $|0\rangle$; ket $|21\rangle$ refers to the first qutrit in state $|2\rangle$ and the second qutrit in state $|1\rangle$; tf is the total evolution time and q is the modal amplitude that is being measured.

According to an embodiment, qudits 10 include first qubit 10A and second qubit 10B, wherein the initial entangled state is an initial linear superposition $$\frac{1}{\sqrt{2}}[|000\rangle + |111\rangle].$$

The intermediate entangled state includes intermediate linear superposition $$\frac{1}{\sqrt{2}}[|100\rangle + e^{-i\vartheta_2}|011\rangle]$$

for some phase $\theta_2$ picked up due to coupling to the inhomogeneous field. The final entangled state includes final linear superposition $$\frac{1}{\sqrt{2}}[|110\rangle + e^{-it_f q}|001\rangle].$$

Physical system 200 is subjected to inhomogeneous field 50 of analyte 4. Exemplary analytes include a planet, an organism (e.g., a human) an organ (e.g., a brain, heart, and the like), a tissue (e.g., cardiac tissue), a molecule (e.g., including a macromolecule such as a protein or nucleic acid), an atom, and the like.

Inhomogeneous field 50 of analyte 4 includes modal amplitude q that is determined by physical system 200 in response to receipt of perturbation pulse 8 by physical system 200 from pulse source 6. Exemplary inhomogeneous fields 50 include an electric field, magnetic field, temperature, gravitational field, strain, and the like, or a combination thereof.

Pulse source 6 provides perturbation pulse 8 to physical system 200. Perturbation pulse 8 can be electromagnetic radiation having a frequency near resonance with the qudit, such as, for example, optical frequencies for optical qubits, microwave frequencies for microwave qubits, or radiofrequencies for radiofrequency qubits. A duration of perturbation pulse 8 is short enough so that inhomogeneous field 50 has negligible effect on qudit 10 during perturbation pulse 8. Perturbation pulse 8 produced by pulse source 6 is received by an individual qudit sensor (e.g., 10A, 10B, . . . , 10N). In response to receipt of perturbation pulse 8 by qudit sensor 10 (e.g., 10A, 10B), the first entangled state is changed to an intermediate entangled state or final entangled state of physical system 200.

Exemplary pulse sources 6 include a laser, a microwave source, a radiofrequency source, or a combination thereof.

Physical system 200 can be made in various ways. In an embodiment, a process for making physical system 200 includes disposing a first qudit sensor 10A at a first position relative to analyte 4 and disposing second qudit sensor 10B at a second position relative to analyte 4 and first qudit sensor 10A. According to an embodiment, a process for making physical system 200 includes providing a substrate; disposing first qudit sensor 10A in the substrate; and disposing second qudit sensor 10B in the substrate at a selected position relative to first qudit sensor 10A.

Physical system 200 has numerous beneficial uses, including determining modal amplitude q of inhomogeneous field 50 of analyte 4. In an embodiment, a process for determining modal amplitude q of inhomogeneous field 50 of analyte 4 includes: preparing an initial entangled state of physical system 200, the initial entangled state including: a first quantum level; a second quantum level; and an energy difference between the second quantum level and the first quantum level, the energy difference being linearly dependent on a strength of inhomogeneous field 50, the initial entangled state being an initial linear superposition of the first quantum level and the second quantum level, and physical system 200 including a plurality of qudit sensors 10; subjecting physical system 200 to inhomogeneous field 50 of analyte 4; subjecting first qudit sensor 10A of quantum sensor 10 to a first perturbation pulse; receiving the first perturbation pulse by first qudit sensor 10A to prepare a first intermediate entangled state of physical system 200, the first intermediate entangled state comprising a first intermediate linear superposition; changing the initial linear superposition to the first intermediate linear superposition in response to receiving the first perturbation pulse by physical system 200; and determining a final entangled state of physical system 200 after applying the first perturbation pulse to determine modal amplitude q of inhomogeneous field 50 of analyte 4.

In the process, preparing an initial entangled state of physical system 200 includes preparing a pure unentangled (i.e., product) state of the qudit sensors. It is contemplated that preparing the initial entangled state of the quantum sensor includes subjecting the qudits to direct entangling interaction among the qudits. Here, the interaction could be, for example, electromagnetic interaction such as electric or magnetic dipole-dipole interaction or a van der Waals interaction. In an aspect, use of interactions between two of the qudits can prepare an entangled state shared between them, and then an interaction between a third qudit and one of the first two qudits can be used to add the third qudit to the entangled state, then a fourth qudit, and the like. Preparing the initial entangled state of the quantum sensor also can include subjecting the qudits to a mediator comprising a photon, a phonon, or a combination thereof. Here, one can entangle a given qudit with a mediator and then send the mediator to the second qudit. Alternatively, one can entangle two qudits with their own mediators and then send the mediators towards each other for a joint measurement. One can then repeat this process to add additional qudits to the entangled state.

In the process, subjecting physical system 200 to inhomogeneous field 50 of analyte 4 includes placing qudit sensors at positions where the knowledge of the inhomogeneous field of interest is needed.

In the process, subjecting first qudit sensor 10A of quantum sensor 10 to a first perturbation pulse includes applying to the qudit sensor a short near-resonant pulse of electromagnetic radiation that has just the right pulse area (equal to π) to transfer the qudit state from $|1\rangle$ to $|2\rangle$ for the case of a terminating pulse or to swap qudit levels $|1\rangle$ and $|2\rangle$ for the case of an echo pulse.

In the process, receiving the first perturbation pulse by first qudit sensor 10A to prepare a first intermediate entangled state of physical system 200 includes transferring the qudit state from $|1\rangle$ to $|2\rangle$ for the case of a terminating pulse or swapping qudit levels $|1\rangle$ and $|2\rangle$ for the case of an echo pulse.

In the process, changing the initial linear superposition to the first intermediate linear superposition in response to receiving the first perturbation pulse by physical system 200 includes transferring the qudit state from $|1\rangle$ to $|2\rangle$ for the case of a terminating pulse or swapping qudit levels $|1\rangle$ and $|2\rangle$ for the case of an echo pulse.

In the process, determining a final entangled state of physical system 200 after applying the first perturbation pulse and after waiting for the final time includes undoing all termination and echo pulses and then projectively measuring each qudit in the $$\frac{1}{\sqrt{2}}[|0\rangle \pm |1\rangle]$$

basis and then multiplying the answers (plus or minus one) to compute the parity P, whose quantum mechanical expectation value depends on modal amplitude q as $\langle P \rangle = \cos(qtf)$. One can then extract q by repeating the experiment many times. Here, modal amplitude q includes a linear combination of a plurality of mode components $\alpha_i$ of a mode A and a plurality of energy components $\theta_i$ as $$q = \sum_i^N \alpha_i \theta_i,$$

wherein N is a total number of qudits 10, and i is an integer from 1 to N.

Figure 10:
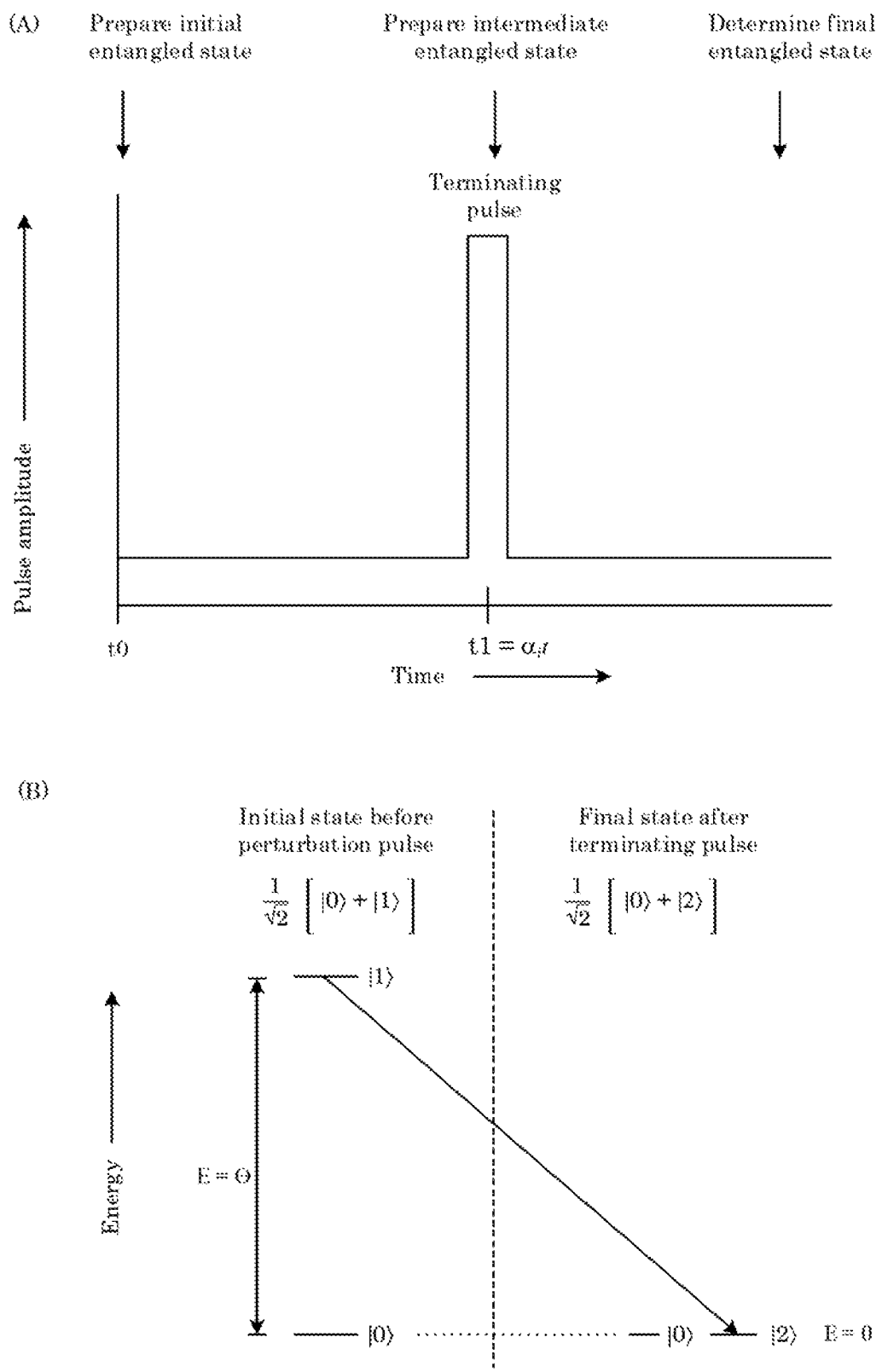
FIG. 10 shows a graph of amplitude of a versus time in panel A, and panel B shows a change from an initial entangled state to a final entangled state in response to subjecting a quantum sensor to a terminating pulse.
Figure 12:
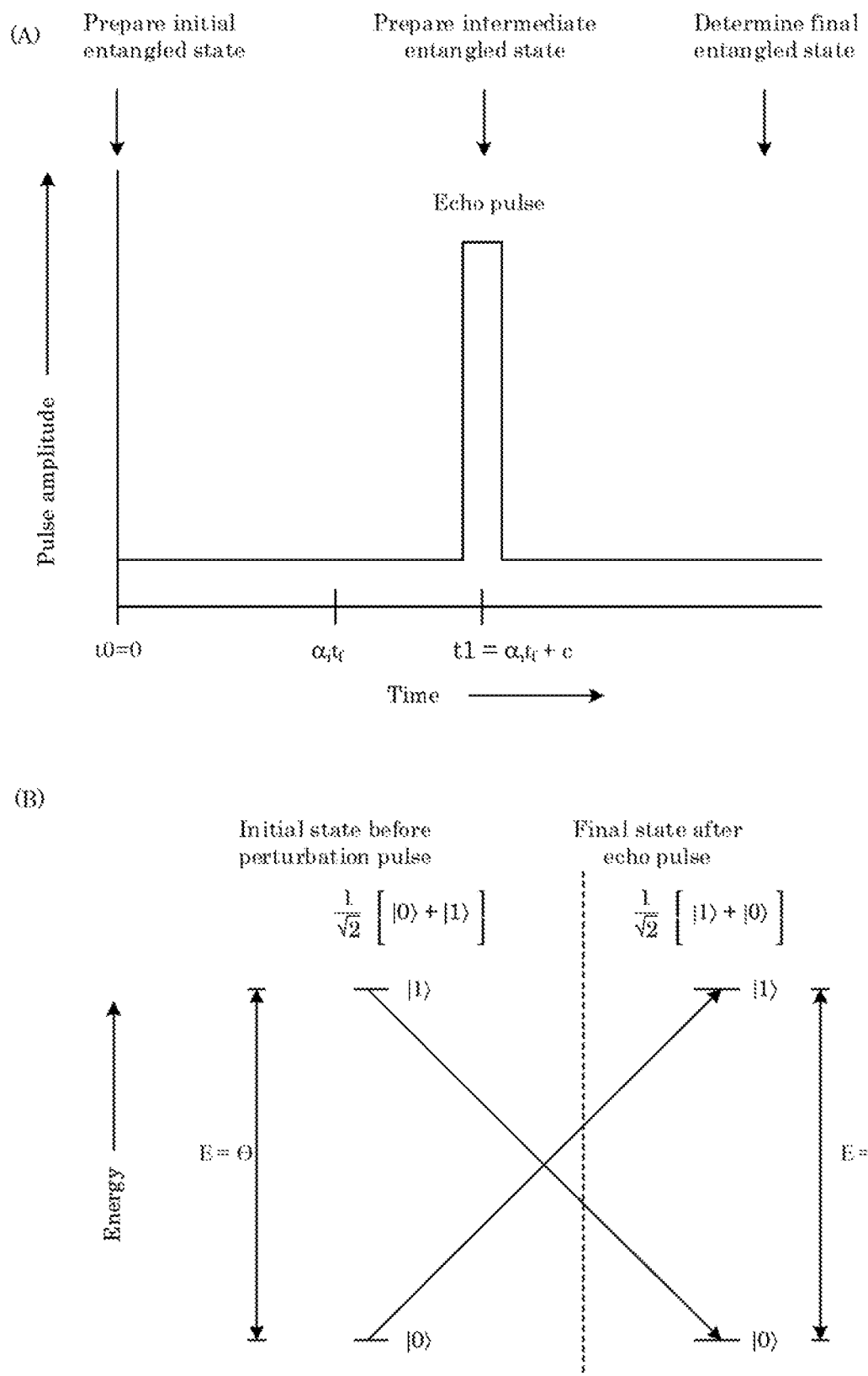
FIG. 12 shows a graph of amplitude of an echo pulse versus time in panel A, and panel B shows a change from an initial entangled state to a final entangled state in response to subjecting a quantum sensor to an echo pulse.
Figure 14:
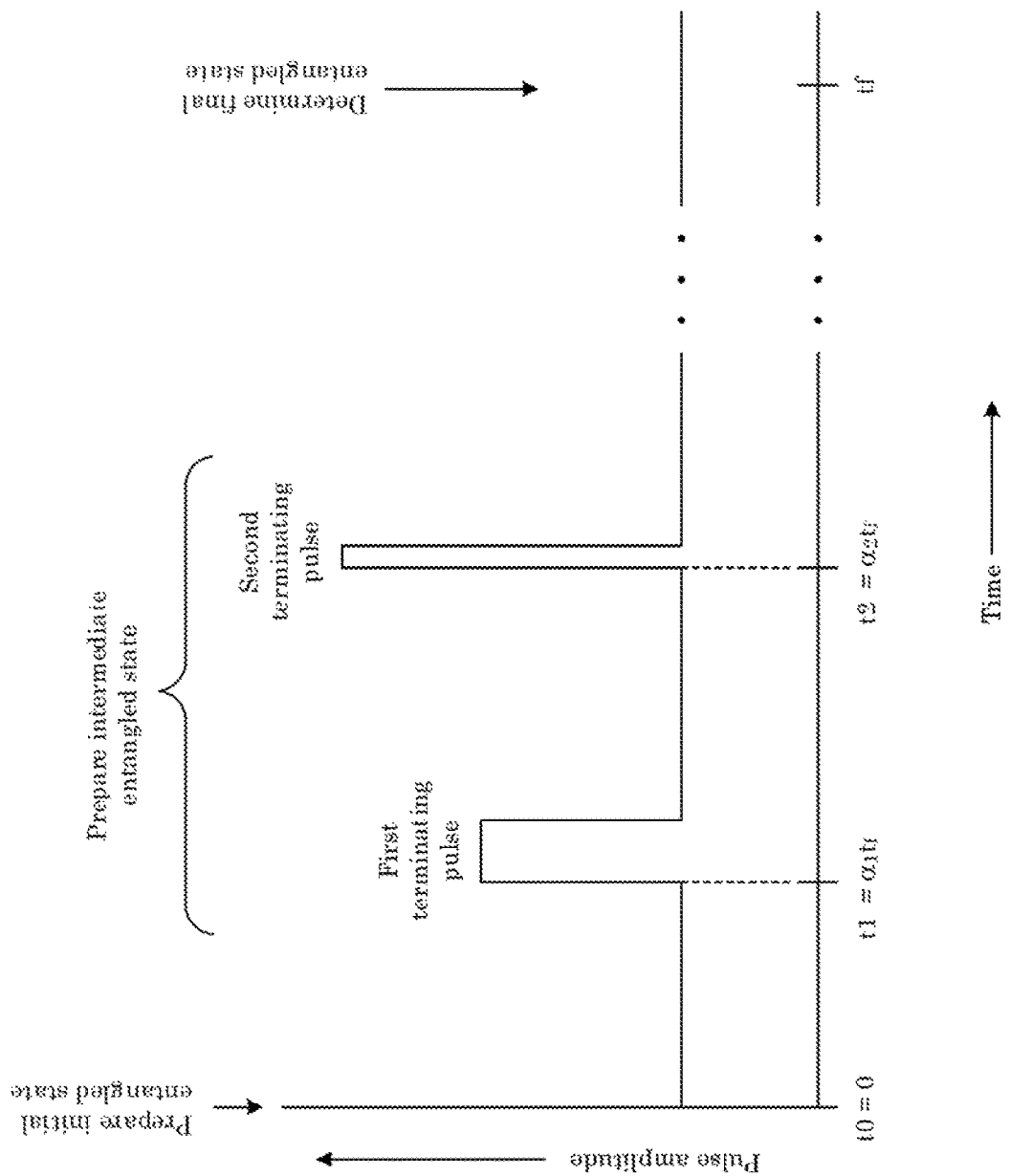
FIG. 14 shows a graph of amplitudes of terminating pulses versus time for subjecting a quantum sensor to a plurality of terminating pulses.
Figure 16:
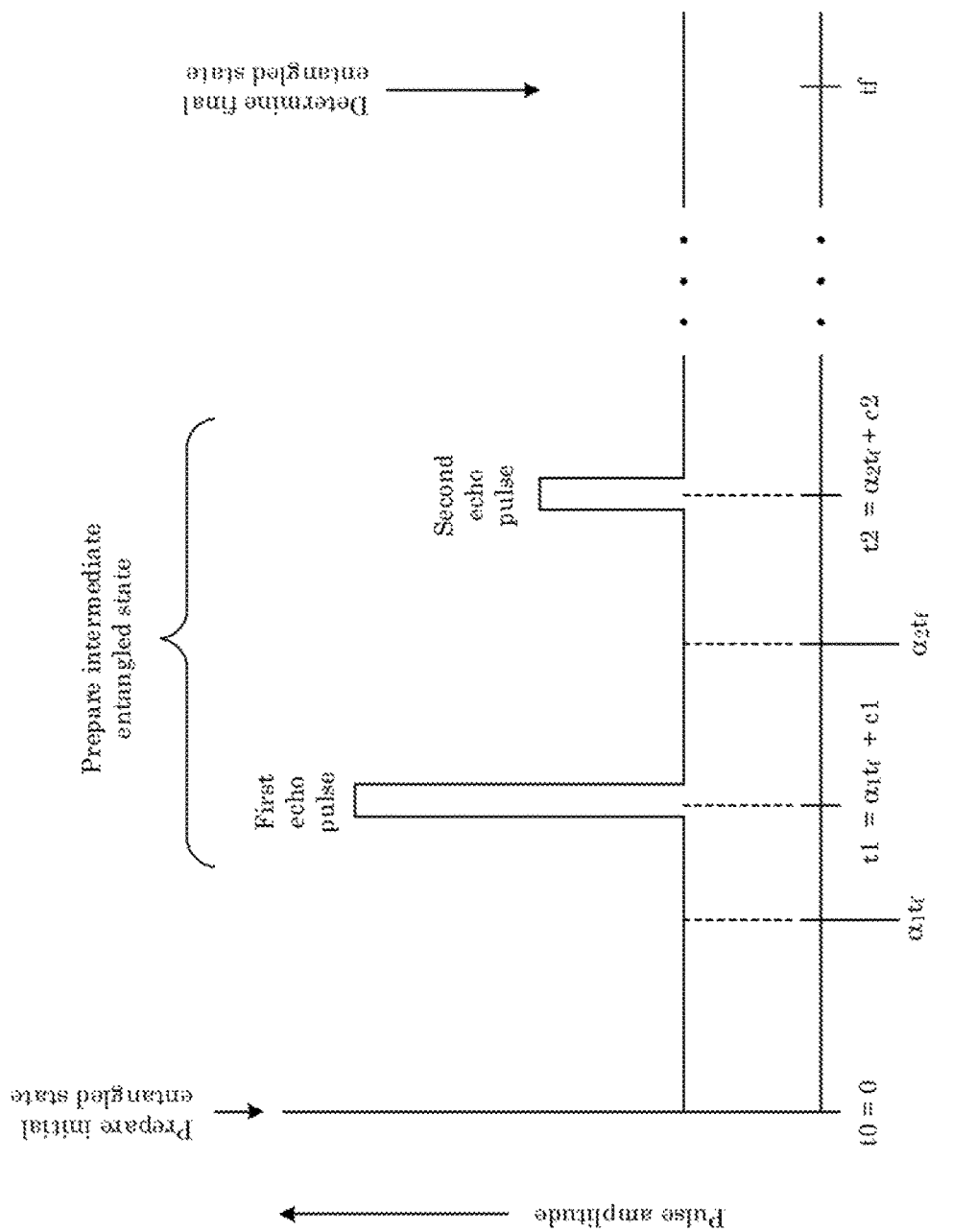
FIG. 16 shows a graph of amplitudes of perturbation pulses versus time for subjecting a quantum sensor to a plurality of echo pulses.
Figure 18:
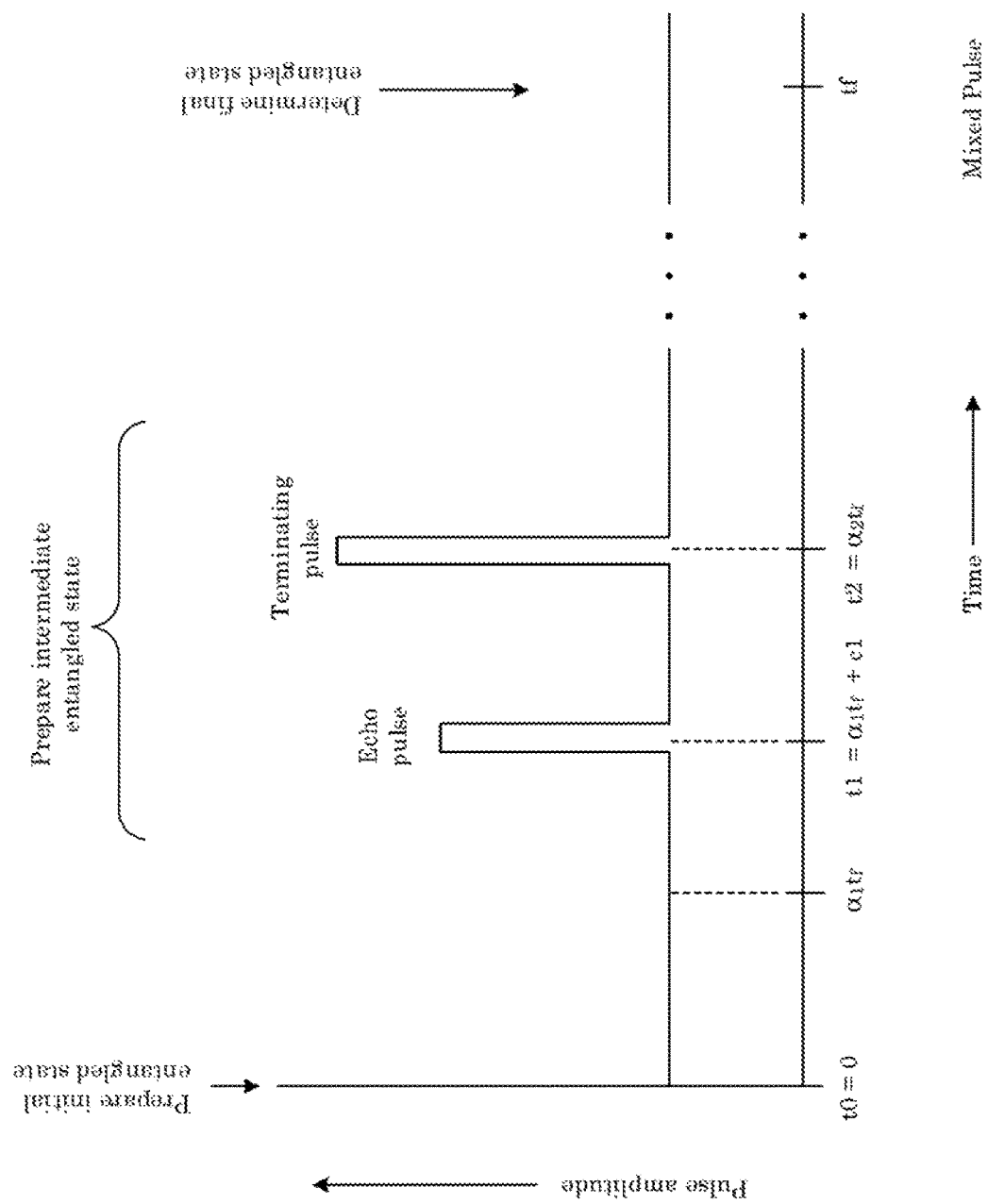
FIG. 18 shows a graph of amplitudes of perturbation pulses versus time for subjecting a quantum sensor to a plurality of perturbation pulses.

With reference to FIG. 10 and FIG. 12, the first pertubation pulse can be a termination pulse as shown in FIG. 10 or an echo pulse as shown in FIG. 12. Further, the process can include subjecting second qudit sensor 10B of quantum sensor 10 to a second perturbation pulse; receiving the second perturbation pulse by second qudit sensor 10B to prepare the second intermediate entangled state of physical system 200, the second intermediate entangled state including a second intermediate linear superposition; changing the first intermediate linear superposition to the second intermediate linear superposition in response to receiving the second perturbation pulse by physical system 200; and determining the final entangled state of the quantum sensor after applying the second perturbation pulse to determine modal amplitude q of inhomogeneous field 50 of analyte 4. In this regard, FIG. 14, FIG. 16, and FIG. 18 show the second perturbation pulse occurring after the first perturbation pulse.

In an embodiment, subjecting first qudit sensor 10A to the first perturbation pulse occurs at a time based on a smallest mode component (i.e., the least $\alpha_i$) of modal amplitude q. It is contemplated that mode components $\alpha_i$ can be scaled to the greatest mode components $\alpha_i$ and reordered according to magnitude so that the minimum mode component is $\alpha_1$, and the maximum mode component is $\alpha_N$. In this manner, the first perturbation pulse occurs at first time t1 based on first mode component $\alpha_1$, and second perturbation pulse occurs at second time t2 based on second mode component $\alpha_2$. Swapping the labels of $|0\rangle$ and $|1\rangle$ allows one to deal with negative values of $\alpha_i$. If $\alpha_i$ are complex, one would repeat the entire procedure twice—once for the real parts, and once for the imaginary parts.

The perturbation pulse can be a terminating pulse or echo pulse. With reference to FIG. 10, which shows a terminating pulse in panel A, an initial entangled state of physical system 200 is prepared at time t0=0, and qudit sensor 10 of physical system 200 is subjected to a terminating pulse at first time $t1 = \alpha_i t_r$, which is a time multiple of i-th mode component $\alpha_i$. As a result, as shown in panel B of FIG. 10, the initial entangled state is changed to a final entangled state in response to receipt of the terminating pulse. Here, the initial entangled state can include, e.g., initial linear superposition of first quantum level $|0\rangle$ and second quantum level $|1\rangle$, wherein the initial entangled state is $1/\sqrt{2}[|0\rangle+|1\rangle]$ having energy difference E=θ between first quantum level $|0\rangle$ and second quantum level $|1\rangle$. The terminating pulse at time t1 transitions second quantum level $|1\rangle$ to third quantum level $|2\rangle$, which is degenerate with first quantum level $|0\rangle$, to produce the final entangled state as $1/\sqrt{2}[|0\rangle+|2\rangle]$ having energy difference E=0. For convenience, the state of the qudit sensor is written as a pure state, but it is actually part of an entangled state with other qudit sensors. Moreover, it also contains a phase due to coupling to inhomogeneous field 50. After time t1, the final entangled state of physical system 200 is determined and used to determine modal amplitude q of inhomogeneous field 50 produced by analyte 4.

Figure 11:
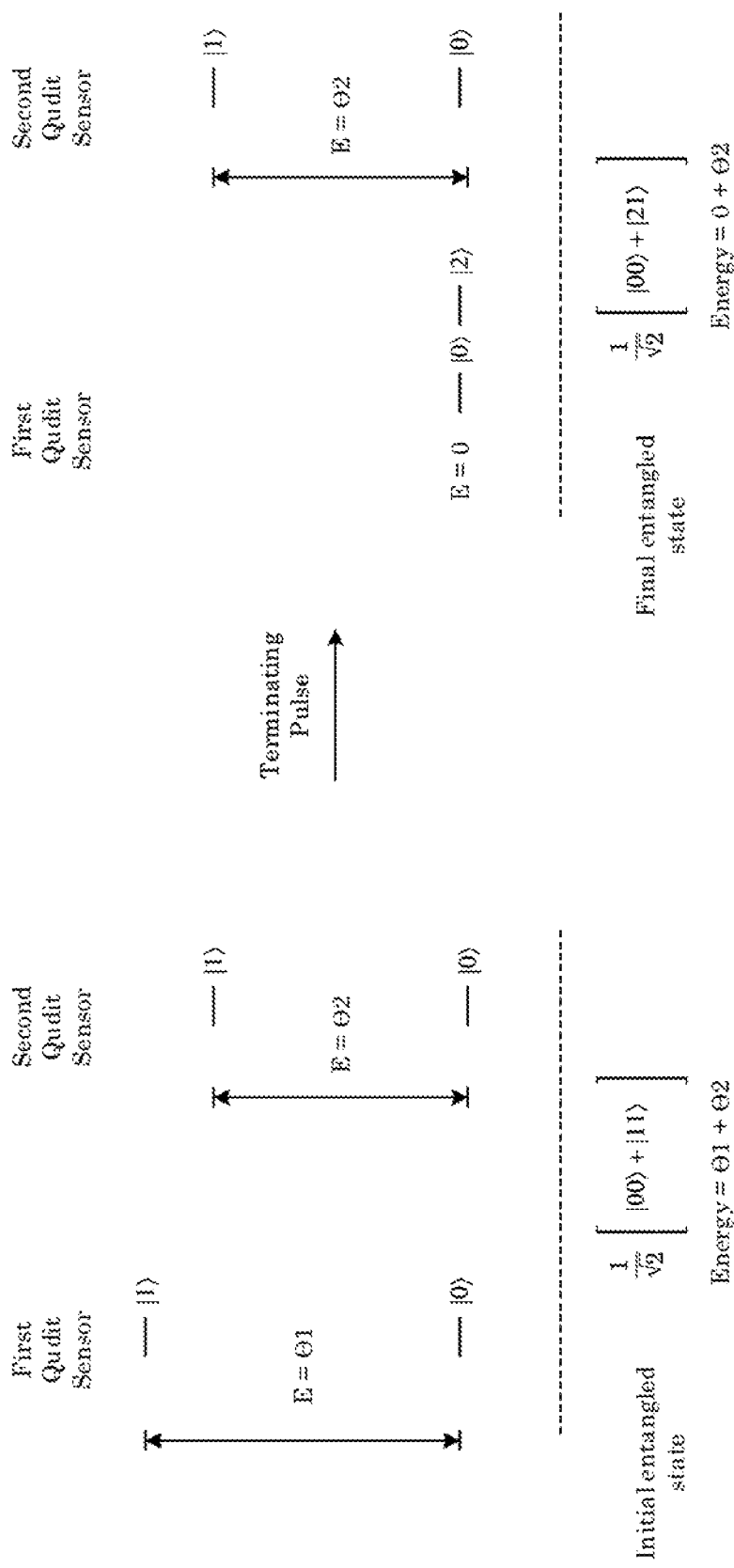
FIG. 11 shows a change from an initial entangled state to a final entangled state in response to subjecting a quantum sensor to a terminating pulse.

In an embodiment, with reference to FIG. 11, physical system 200 includes a first qudit sensor 10A (having quantum levels $|0\rangle$ and $|1\rangle$ with energy difference E=θ1) and second qudit sensor 10B (having quantum levels $|0\rangle$ and $|1\rangle$ with energy difference E=θ2), wherein physical system 200 has initial entangled state $1/\sqrt{2}[|00\rangle+|11\rangle]$ having energy difference E=θ1+θ2 between first quantum level $|00\rangle$ and second quantum level $|11\rangle$. A first terminating pulse is subjected to first qudit sensor 10A at time $t1=\alpha_1 t_f$ to produce final entangled state $1/\sqrt{2}[|00\rangle+e^{-it_1(\theta1+\theta2)}|21\rangle]$ having energy difference E=θ2, where the phase was acquired during the time t1 via coupling to inhomogeneous field 50. This entangled state then evolves for time tf–t1 to produce state $1/\sqrt{2}[|00\rangle+e^{it_f}_q|21\rangle]$. It is convenient to undo the terminating pulse at the end to give state $1/\sqrt{2}[|00\rangle+e^{-it_f}_q|11\rangle]$, which is then measured.

In an embodiment, perturbation pulse includes an echo pulse. With reference for FIG. 12, which shows an echo pulse in panel A, an initial entangled state of physical system 200 is prepared at time t0, and qudit sensor 10 of physical system 200 is subjected to an echo pulse at first time $t1=\alpha_i t_f+c$, which is after a time multiple of i-th mode component $\square_i$ by a selected time amount $c=tf(1-\alpha_i)/2$. As a result, as shown in panel B of FIG. 12, the initial entangled state is changed to a final entangled state in response to receipt of the echo pulse. Here, the initial entangled state can include, e.g., initial linear superposition of first quantum level $|0\rangle$ and second quantum level $|1\rangle$, wherein the initial entangled state is $1/\sqrt{2}[|0\rangle+|1\rangle]$ having energy difference E=θ between first quantum level $|0\rangle$ and second quantum level $|1\rangle$. The echo pulse at time t1 exchanges second quantum level $|1\rangle$ with first quantum level $|0\rangle$ to produce the final entangled state as $1/\sqrt{2}[|1\rangle+|0\rangle]$ having energy difference E=–θ. For convenience, the state of the qudit sensor is written as a pure state, it is actually part of an entangled state with other qudit sensors and it also contains a phase picked up due to coupling to inhomogeneous field 50. After time t1, the final entangled state of physical system 200 is determined and used to determine modal amplitude q. of physical system 200.

Figure 13:
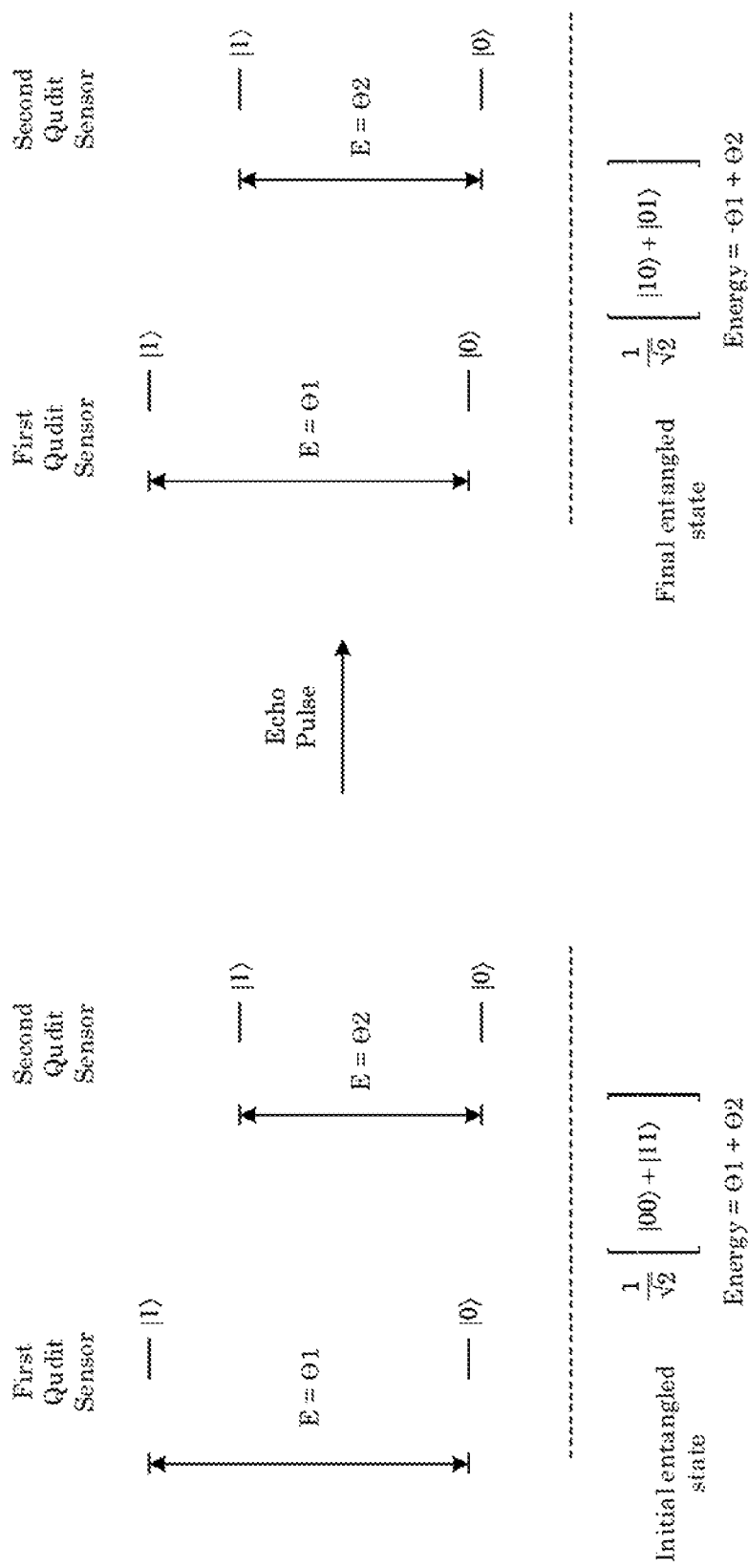
FIG. 13 shows a change from an initial entangled state to a final entangled state in response to subjecting a quantum sensor to an echo pulse.

In an embodiment, with reference to FIG. 13, physical system 200 includes a first qudit sensor 10A (having quantum levels $|0\rangle$ and $|1\rangle$ with energy difference E=θ1) and second qudit sensor 10B (having quantum levels $|0\rangle$ and $|1\rangle$ with energy difference E=θ2), wherein physical system 200 has initial entangled state $1/\sqrt{2}[|00\rangle+|11\rangle]$ having energy difference E=θ1+θ2 between first quantum level $|00\rangle$ and second quantum level $|11\rangle$. A first echo pulse is subjected to first qudit sensor 10A at time $t1=\alpha_1 t_f+c$ in which levels of first qudit sensor 10A are exchanged (i.e., $|0\rangle \leftrightarrow |1\rangle$) to produce final entangled state $1/\sqrt{2}[|10\rangle+e^{-it_1(\theta1+\theta2)}|01\rangle]$ having energy difference E=–θ1+θ2, where the phase was acquired during the time t1 via coupling to the inhomogeneous field. This entangled state then evolves for time tf–t1 to produce state $1/\sqrt{2}[|00\rangle+e^{-it_f}_q|01\rangle]$. It is convenient to undo the echo pulse at the end to give state $1/\sqrt{2}[|00\rangle+e^{-it_f}_q|11\rangle]$, which is then measured.

Figure 15:
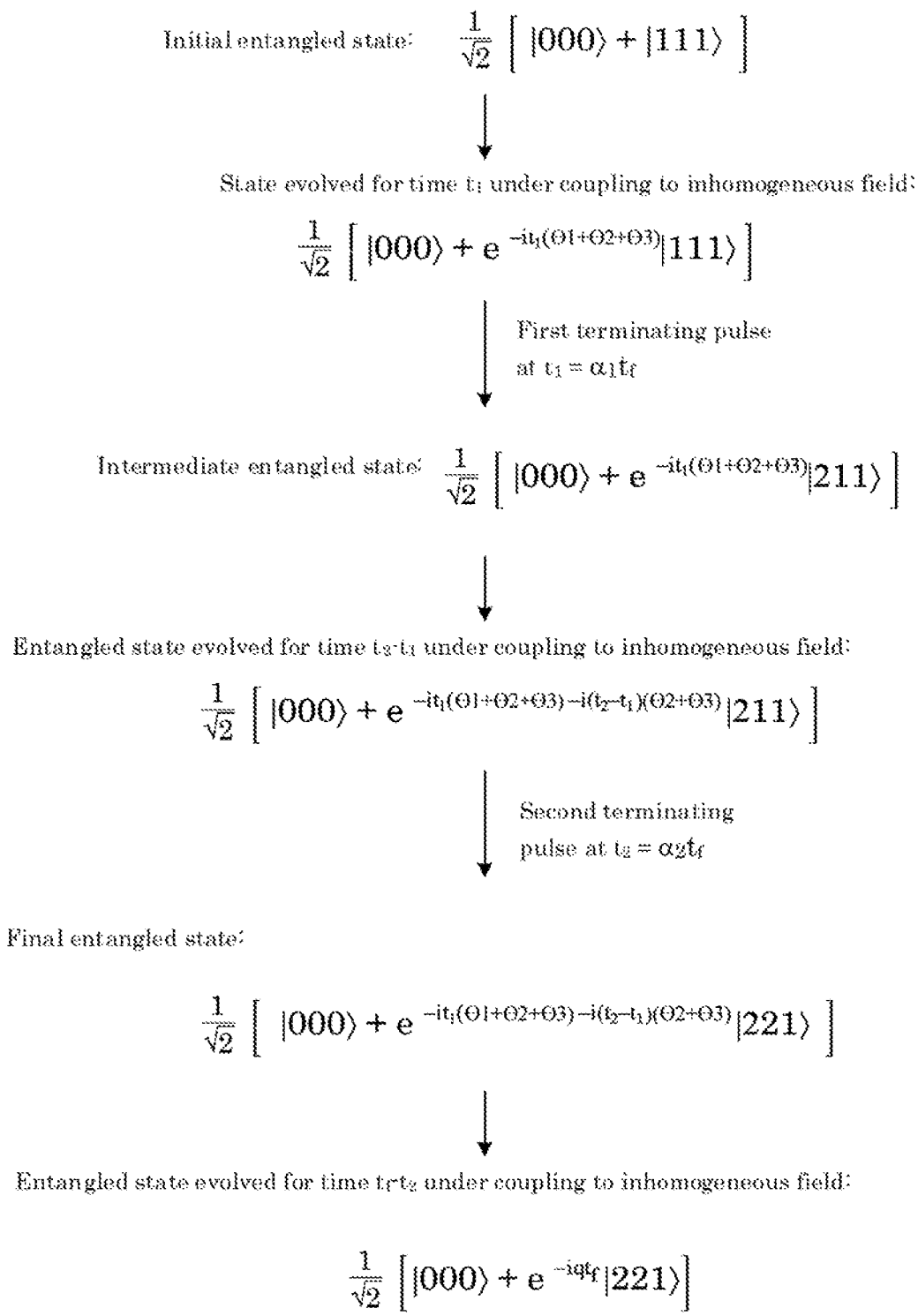
FIG. 15 shows a change from an initial entangled state to a final entangled state through an intermediate entangled state in response to subjecting a quantum sensor to a plurality of terminating pulses.

In an embodiment, with reference to FIG. 14, physical system 200 including a plurality of qudits 10 (e.g 10A, 10B, and the like) is subjected to preparation of an initial entangled state at time t0=0, which is subjected to a plurality of perturbation pulses, e.g., terminating pulses. At time t1, first qudit 10A is subjected to a first terminating pulse to prepare first intermediate entangled state. At time t2, second qudit 10B is subjected to a second terminating pulse to prepare a final entangled state that is subjected to determination for obtaining modal amplitude q. Here, as shown in FIG. 15, the initial entangled state of physical system 200 can be $1/\sqrt{2}[|000\rangle+|111\rangle]$ such that first terminating pulse at time t1 produces intermediate entangled state $1/\sqrt{2}[|000\rangle+e^{-it_1(\theta1+\theta2+\theta3)}|211\rangle]$, which is subjected to second terminating pulse at time t2 to produce final entangled state $1/\sqrt{2}[|000\rangle+e^{-it_1(\theta1+\theta2+\theta3)-i(t_2-t_1)(\theta2+\theta3)}|221\rangle]$. This entangled state then evolves for time tf–t2 to produce state $1/\sqrt{2}[|000\rangle+e^{-it_f}_q|221\rangle]$. It is convenient to undo the terminating pulses at the end to give state $1/\sqrt{2}[|000\rangle+e^{-it_f}_q|111\rangle]$, which is then measured.

Figure 17:
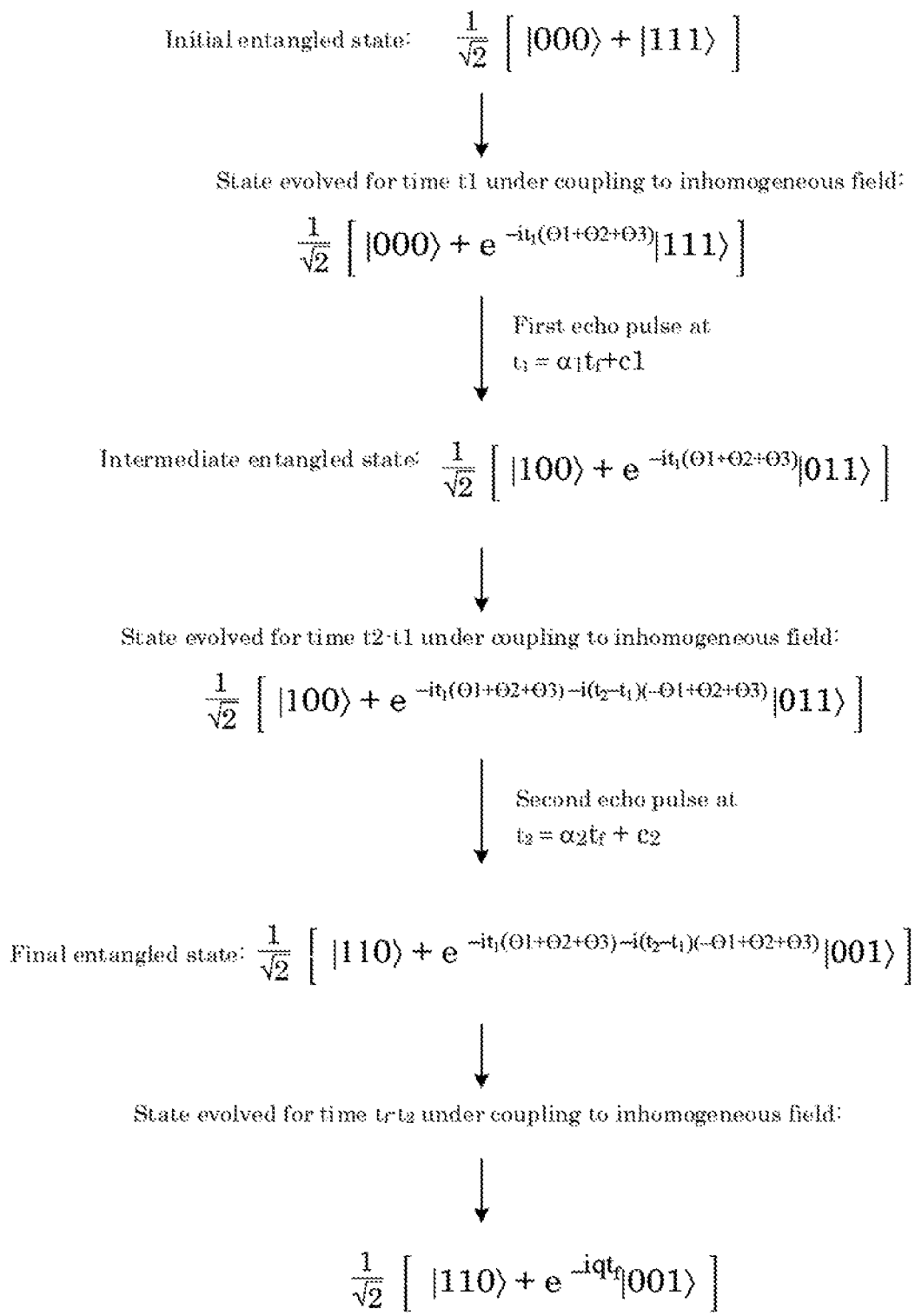
FIG. 17 a change from an initial entangled state to a final entangled state through an intermediate entangled state in response to subjecting a quantum sensor to a plurality of echo pulses.

In an embodiment, with reference to FIG. 16, physical system 200 including a plurality of qudits 10 (e.g., 10A, 10B, and the like) is subjected to preparation of an initial entangled state at time t0, which is subjected to a plurality of perturbation pulses e.g., echo pulses. At time t1, first qudit 10A is subjected to a first echo pulse to prepare first intermediate entangled state. At time t2, second qudit 10B is subjected to a second echo pulse to prepare a final entangled state that is subjected to determination for obtaining modal amplitude q. Here, as shown in FIG. 17, the initial entangled state of physical system 200 can be $1/\sqrt{2}[|000\rangle+|111\rangle]$ such that first echo pulse at time t1 produces intermediate entangled state $1/\sqrt{2}[|100\rangle+e^{-it_1(\theta1+\theta2+\theta3)}|011\rangle]$, which is subjected to second echo pulse at time t2 to produce final entangled state $1/\sqrt{2}[|110\rangle+e^{-it_1(\theta1+\theta2+\theta3)-i(t_2-t_1)(-\theta1+\theta2+\theta3)}|001\rangle]$. This entangled state then evolves for time tf–t2 to produce state $1/\sqrt{2}[|110\rangle+e^{-it_fq}|000\rangle]$. It is convenient to undo the echo pulses at the end to give state $1/\sqrt{2}[|000\rangle+e^{-it_fq}|111\rangle]$, which is then measured.

Figure 19:
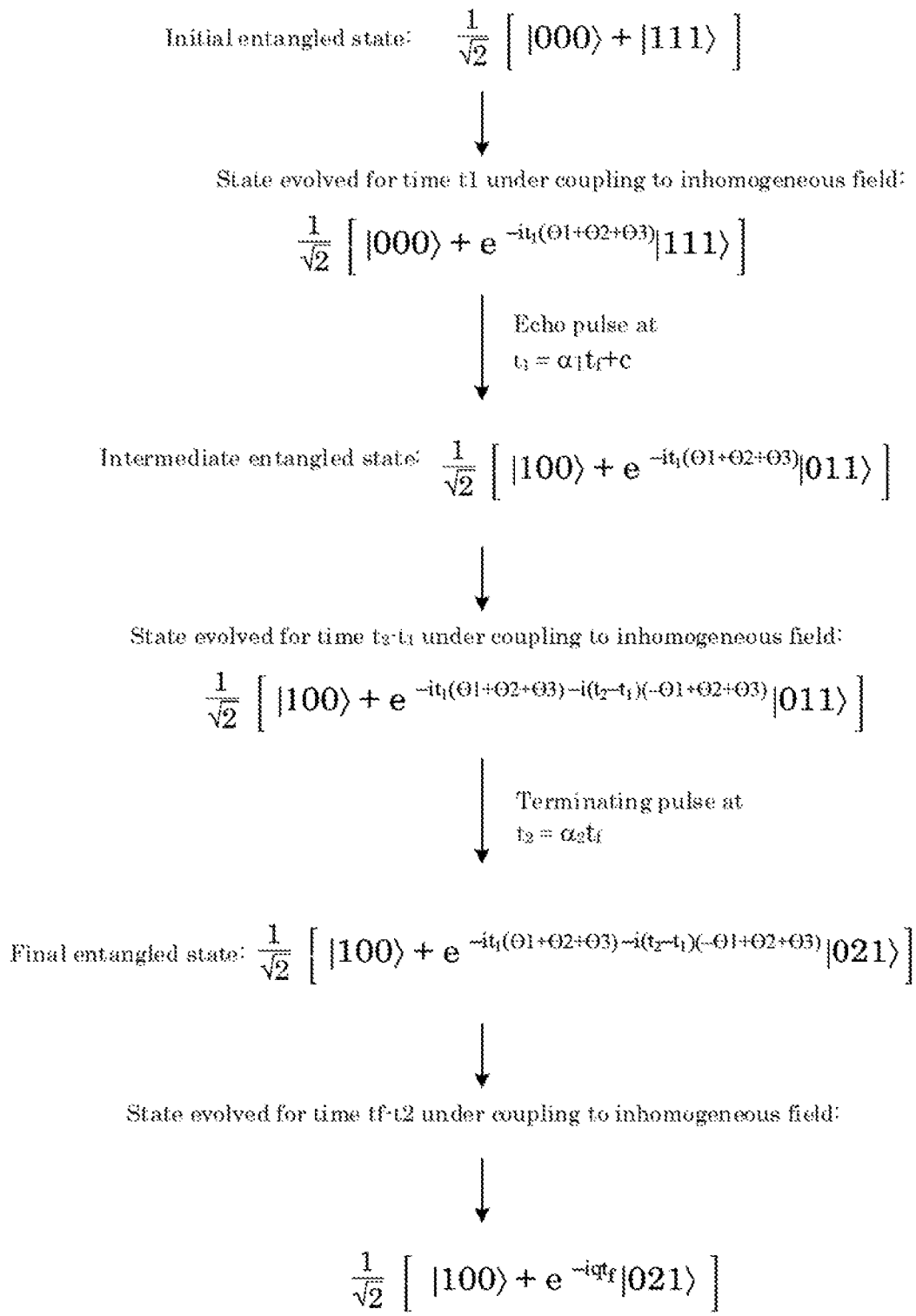
FIG. 19 shows a change from an initial entangled state to a final entangled state through an intermediate entangled state in response to subjecting a quantum sensor to a plurality of perturbation pulses.

In an embodiment, with reference to FIG. 18, physical system 200 including a plurality of qudits 10 (e.g 10A, 10B, and the like) is subjected to preparation of an initial entangled state at time t0, which is subjected to a plurality of perturbation pulses e.g., a combination of echo pulses and terminating pulses. At time t1, first qudit 10A is subjected to an echo pulse to prepare first intermediate entangled state. At time t2, second qudit 10B is subjected to a terminating pulse to prepare a final entangled state that is subjected to determination for obtaining modal amplitude q. is contemplated that, as shown in FIG. 19, the initial entangled state of physical system 200 can be $1/\sqrt{2}[|000\rangle+|111\rangle]$ such that the echo pulse at time t1 produces intermediate entangled state $1/\sqrt{2}[|100\rangle+e^{-it_1(\theta1+\theta2+\theta3)}|011\rangle]$, which is subjected to terminating pulse at time t2 to produce final entangled state $1/\sqrt{2}[|100\rangle+e^{-it_1(\theta1+\theta2+\theta3)-i(t_2-t_1)}(-\theta1+\theta2+\theta3)|021\rangle]$. This entangled state then evolves for time tf–t2 to produce state $1/\sqrt{2}[|100\rangle+e^{-it_fq}|021\rangle]$. It is convenient to undo the perturbation pulses at the end to give state $1/\sqrt{2}[|000\rangle+e^{-it_fq}|111\rangle]$, which is then measured.

Figure 20:
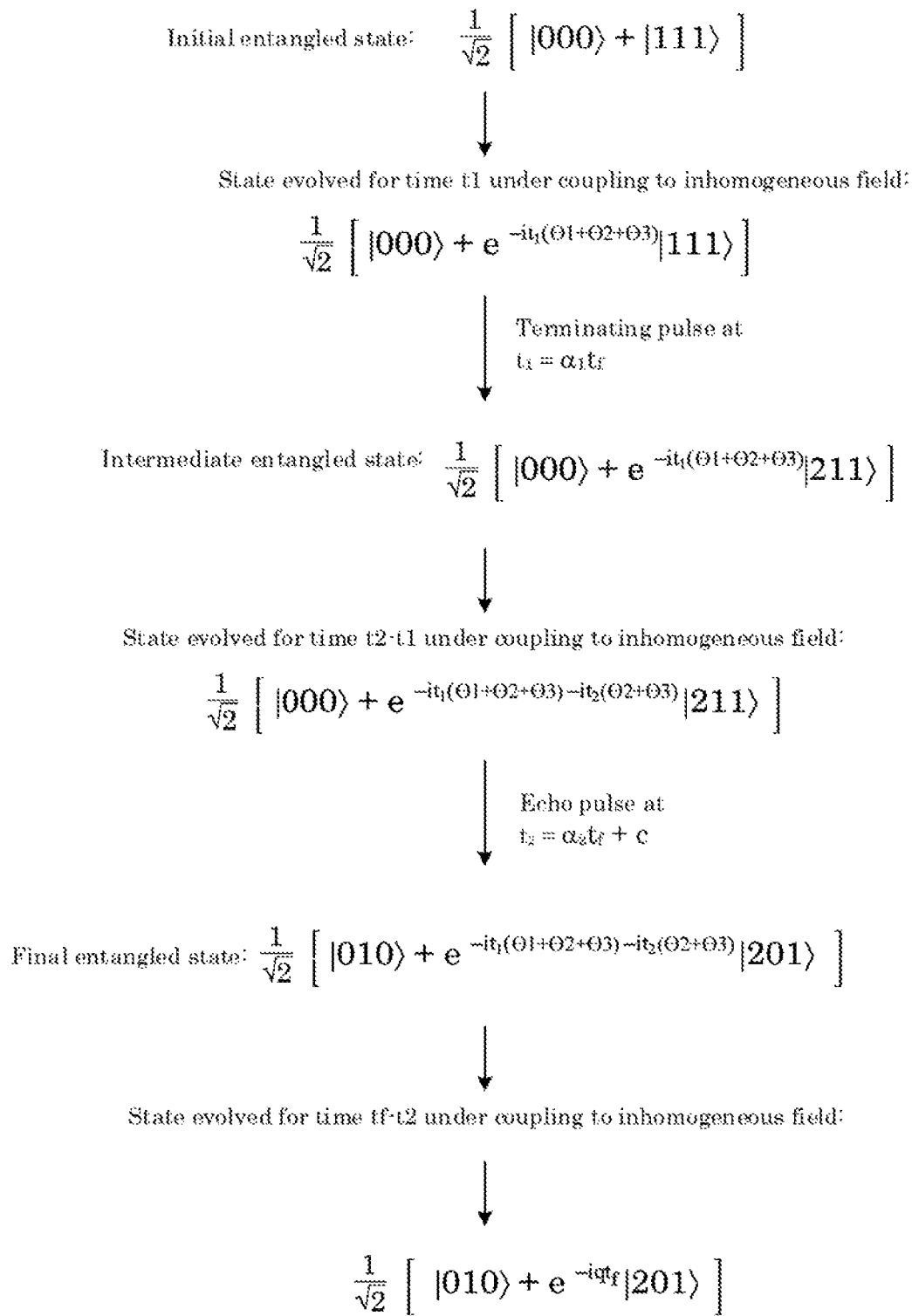
FIG. 20 shows a change from an initial entangled state to a final entangled state through an intermediate entangled state in response to subjecting a quantum sensor to a plurality of perturbation pulses.

In a plurality of perturbation pulses, a sequence of the perturbation pulses can be a selected sequence of terminating pulses in the echo pulses in a selected number of the terminating pulses and echo pulses. In an embodiment, with reference to FIG. 20, initial entangled state of physical system 200 can be $1/\sqrt{2}[|000\rangle+|111\rangle]$ such that the terminating pulse at time t1 produces intermediate entangled state $1/\sqrt{2}[|000\rangle+e^{-it_1(\theta_1+\theta_2+\theta_3)}|211\rangle]$, which is subjected to an echo pulse at time t2 to produce final entangled state $1/\sqrt{2}[|010\rangle+e^{-it_1(\theta_1+\theta_2+\theta_3)-i(t_2-t_1)(\theta_2+\theta_3)}|201\rangle]$. This entangled state then evolves for time tf–t2 to produce state $1/\sqrt{2}[|010\rangle+e^{-it_f q}|201\rangle]$. It is convenient to undo the perturbation pulses at the end to give state $1/\sqrt{2}[|000\rangle+e^{-it_f q}|111\rangle]$, which is then measured.

The articles and processes herein are illustrated further by the following Example, which is non-limiting Example Heisenberg-scaling measurement process for analytic functions with quantum sensor networks.

For d input parameters, entanglement can yield a factor O(d) improvement in mean-squared error when estimating an analytic function of these parameters. The process is optimal for qubit sensors and for photons passing through interferometers. The applies to continuous variable measurements, such as one quadrature of a field operator. Applications include calibration of laser operations in trapped ion quantum computing.

Entanglement is a resource for quantum technology. In metrology, entangled probes provide more accurate measurements than unentangled probes. In addition to using entangled probes to enhance the measurement of a single parameter, using entanglement to estimate many parameters at once, or a function of those parameters, has applications for nanoseale nuclear magnetic resonance imaging.

A lower bound on the variance of an estimator of a linear combination of d parameters coupled to d qubits is provided. We generalize measurement of an arbitrary real-valued, analytic function of d parameters and show that entanglement reduces variance of such an estimate by a factor of O(d). Described is a process that provides optimal variance asymptotically in the limit of long measurement time. In addition, when the parameters are coupled to d interferometers or to a combination of interferometers and qubits, an analogous Heisenberg-scaling process to improve measurement noise is provided. The process couples parameters to continuous variables detected by homodyne measurements.

The process applies to field interpolation. Suppose sensors are placed at d spatially separated locations, but we wish to know the field at a point with no sensor. We may pick a reasonable ansatz for the field with no more than d parameters, use our d measurements to fix the degrees of freedom of that ansatz, and compute the field at our desired point. Because the field of interest is a function of the field at d other locations, the process offers reduced noise over performing the same procedure without using entanglement.

Here, bold face font indicated vectors, hats (as in $\hat{H}$) indicate operators, and variables with a tilde (such as $\tilde{f}$) are estimators of the corresponding quantity with no tilde (such as f). The notation $E_Y[X]$ means the expected value of X over all possible Y. If we merely write $E[X]$, then we average over all parameters required to define X (e.g. if Y depended on Z, then $E_Z[E_Y[X]]$). We define the variance, $Var_Y[X]$ similarly.

We consider a system with d sensor nodes, where node i consists of a single qubit coupled to a real parameter $\theta_i$ (see FIG. 3), and suppose that the state evolves under the Hamiltonian $$\hat{H} = \hat{H}_c(t) + \frac{1}{2}\theta_i \hat{\sigma}_i^a, \qquad (1)$$

where $\hat{\sigma}_i^{x,y,z}$ are the Pauli operators acting on qubit i and $H_c(t)$ is a time-dependent control Hamiltonian that we choose, which may include coupling to ancilla qubits. Here, and throughout the paper, repeated indices indicate summation. We want to measure an arbitrary real-valued, analytic function $f(\theta)$ of d unknown parameters $\theta=(\theta_1 \ldots \theta_d)$ for time $t_{total}$. Determine how well the quantity $f(\theta)$ can be estimated and find a process for doing so. To specify a process, we choose an input state, a control Hamiltonian $H_c(t)$, and a final measurement.

For a general estimator, we use the mean squared error (MSE) M of our estimate $\tilde{f}$ from the true vale $f(\theta)$ as a figure of merit. Explicitly, $$M = E[(\tilde{f} - f(\theta))^2] = Var\,\tilde{f} + (E[\tilde{f}] - f(\theta))^2. \qquad (2)$$

Thus, the MSE accounts for both the variance and the bias of the estimator $\tilde{f}$. By proving lower-bounds for M and then showing that these bounds are saturable, we will be demonstrating process which are optimal in this combination of bias and variance.

With regard to a lower bound on error, we now identify the minimum possible error of an estimator of $f(\theta)$ which measures for time. For any estimator $\tilde{f}$, biased or otherwise, which uses samples from a probabilistic process (such as physical experiments) to estimate the value $f(\theta)$, the MSE is bounded by $$\mathbb{E}[(\tilde{f} - f(\theta))^2] \geq \frac{1}{F} \geq \frac{1}{F_Q}, \qquad (3)$$

where F is the Fisher information for the parameter f and $F_Q$ is the quantum Fisher information evaluated over our input state, with $F_Q \geq F$ always. Bounds on the error of an estimator in terms of the Fisher information are known as Cramér-Rao bounds. The Fisher information measures the sensitivity of the sampled probability distribution to changes in the parameters $\theta$. While F tells us something about a particular experimental setup, $F_Q$ is maximized over all possible experiments that could be performed on a state.

In order to evaluate the Fisher information for our function of interest f, we will use a method for linear functions. We start by evaluating the generator $\hat{g}=\partial\hat{H}/\partial f$. By first writing the chain rule, we find that $$\hat{g} = \frac{\partial \hat{H}}{\partial f} = \frac{\partial \hat{H}}{\partial \theta_i}\frac{\partial \theta_i}{\partial f} = \frac{1}{2}\hat{\sigma}_z^j \frac{\partial \theta_i}{\partial f}. \qquad (4)$$

Note that $F_Q$ can be upper-bounded by the seminorm of this generator, $F_Q \leq t^2 |\hat{g}|_s^2$. (The seminorm of an operator is the difference between its maximum and minimum eigenvlues.) However, to evaluate the seminorm we will need to evaluate the partial derivative in Eq. (4). To do so we must specify a full basis of functions so that the partial derivative can be defined, which requires specifying which variables are held constant during differentiation. We suppose that a set of functions $f_1, f_2, f_3 \ldots f_N$ are created, with the f of interest equal to $f_1$, defining an invertible coordinate transformation on a region $R^N$ around the point θ. The seminorm is then:

$$\|\hat{g}\|_s = \sum_{i=1}^{N} \left|\frac{\partial \theta_i}{\partial f}\right| = \sum_{i=1}^{N} |J_{i1}^{-1}|. \quad (5)$$

Here, $J_{ij}^{-1}$ is an element of the Jacobian matrix of the inverse transformation to that defined by the f functions. Depending on which functions are chosen, the value of $|\hat{g}|_s$ can vary for linear functions. We therefore wish to find the smallest possible $|\hat{g}|_s$, which will provide the tightest possible bound on $F_Q$. To do so, we note that $J^{-1}$ and $J$ must obey an inverse relationship, meaning that the following chain of inequalities holds, $$1 = J_{1i}J_{i1}^{-1} \leq |J_{1i}||J_{i1}^{-1}| \leq \max_j |J_{1j}| \sum_{i=1}^{N} |J_{i1}^{-1}|. \quad (6)$$

By using the definition of the Jacobian, we can rewrite this as a lower bound on the value of $|\hat{g}|_s$ in terms of partial derivatives of f:

$$\|\hat{g}\|_s = \sum_{i=1}^{N} |J_{i1}^{-1}| \geq \left(\max_j \left|\frac{\partial f}{\partial \theta_j}\right|\right)^{-1}. \quad (7)$$

If we label the $\theta_i$ that yields the maximum first derivative as $\theta_1$, and then choose $f_i = \theta_i$ for $i > 1$, the lower bound in Eq. (7) is met since $\partial\theta_i/\partial f_1$ must be evaluated holding the other $f_i$ constant. Invoking the resulting bound on the quantum Fisher information, we find that the quantum Cramér-Rao bound becomes $$M = \mathbb{E}\left[(\tilde{f} - f(\theta))^2\right] \geq \frac{1}{F_Q} \geq \max_j \frac{\left|\frac{\partial f}{\partial \theta_j}\right|^2}{t^2}. \quad (8)$$

Although the quantum Cramér-Rao bound derived in Eq. (8) cannot always be saturated, it can when the generators $\partial H/\partial \theta_i$ commute, as in Eq. (1). We will show later that the inequality in Eq. (8) can be saturated at asymptotic time $t_{total}$.

From this point forward, to simplify later calculation, we define $$f_i(\theta) = \frac{\partial f(\theta)}{\partial \theta_i}.$$

This definition also generalizes to multiple partial derivatives (i.e.

$$f_{ij} = \frac{\partial}{\partial \theta_j}\frac{\partial f}{\partial \theta_i}).$$

Before moving on to the optimal process, we will consider a process which does not use entanglement and does not saturate Eq. (8) as a useful contrast to an entangled strategy. Suppose we estimate each parameter individually, without bias. Then the MSE $\mathbb{E}\left[(f(\tilde{\theta}) - f(\theta))^2\right]$ can be written as $$M_{unentangled} = f_i(\theta)^2 \text{Var}\tilde{\theta}_i \quad (9)$$

Here we assume the measurement of each single parameter can be made in time t with $\text{Var }\tilde{\theta}_i = 1/t^2$, the Heisenberg limit for single particles and therefore the best possible measurement for a non-entangled process. Estimation processes allow one to reach a variance proportional to $1/t^2$ without entanglement; an experimental realization of single phase estimation without entanglement was performed. While in realistic settings a Heisenberg-limited measurement on one particle may be challenging and include some constant overhead above $1/t^2$, this assumption allows us to identify the improvement possible by using entanglement. Our entanglement-free figure of merit is $$M_{unentangled} = \frac{\|\nabla f(\theta)\|^2}{t_{total}^2}, \quad (10)$$

where the $\|\cdot\|$ in Eq. (10) denotes the Euclidean norm. More generally, we use $\|v\|_p$ to denote the p-norm of vector v. Since Eq. (10) only saturates Eq. (8) in trivial cases where $\nabla f(\theta)$ is zero in all but one component, the unentangled process described is not optimal.

In a two-step process, we now present a process which asymptotically saturates Eq. (8). Our process consists of two steps. First, we make an unbiased estimate $\tilde{\theta}$ of θ for time $t_1$. Second, given our estimates $\tilde{\theta}$, we make an unbiased measurement $\tilde{q}$ of the quantity $q = \nabla f(\theta) \cdot (\theta - \tilde{\theta})$ using a linear combination process, which takes time $t_2$. Our final estimate is $\tilde{f} = f(\tilde{\theta}) + \tilde{q}$.

It can be shown that our process is optimal (in terms of scaling with the total time $t_1 + t_2$) provided that the individual estimations of the parameters satisfy $\mathbb{E}\left[(\tilde{\theta}_i - \theta_i)^4\right] = O(t_1^{-4})$ and that $t_1$ and $t_2$ are chosen properly. To simplify our computations, we will make the more concrete assumption that our initial estimates $\tilde{\theta}$ are each normally distributed as $\mathcal{N}(0, \text{Var}\tilde{\theta}_i)$. The figure of merit for this process is $$M = \mathbb{E}\left[(f(\tilde{\theta}) + \tilde{q} - f(\theta))^2\right] \quad (11)(12)$$

$$= \mathbb{E}[\text{Var}_{\tilde{q}}\tilde{q}] + \frac{2f_{ij}(\theta) + f_{ij}(\theta)f_{ij}(\theta)}{4}\text{Var}\tilde{\theta}_i \text{Var}\tilde{\theta}_j$$

In Eq. (12), the first term is the error resulting from the second phase of the process, estimating the linear combination. The second term is a residual error remaining from the first phase of the process after it is corrected by the linear combination measurement. For our particular Hamiltonian $\hat{H} = \frac{1}{2}\theta_i \delta f$, we know that the minimum variance of an unbiased estimator of some linear combination $\alpha \cdot \theta$ given time t is $$\text{Var}\alpha \cdot \theta \geq \frac{\max_i \alpha_i^2}{t^2} \quad (13)$$

which can be achieved with the entangled GHZ state $$|\psi_{spin}\rangle = \frac{1}{\sqrt{2}}(|0\rangle^{\otimes d} + |1\rangle^{\otimes d}).$$

We can apply this linear combination process to the second phase of our process by setting $\alpha = \nabla f(\tilde{\theta})$. For the individual estimators of the first phase, we use the fact that an individual estimation can be made in time t with variance $1/t^2$. Using these results, we simplify Eq. (12);

$$M = \mathbb{E}\left[\frac{\max_i f_i(\tilde{\theta})^2}{t_2^2}\right] + \frac{2f_{ij}(\tilde{\theta}) + f_{ii}(\tilde{\theta})f_{jj}(\tilde{\theta})}{4} \quad (14)$$

$$M = \frac{\mathbb{E}\left[\max_1 f_1(\tilde{\theta})^2\right]}{t_2^2} + \frac{g_1(\tilde{\theta})}{t_1^4} \quad (15)$$

where we have absorbed the second derivatives into $g_1(\theta)$, which does not depend on time. Without loss of generality, we designate $f_1(\theta)$ as the largest $f_i(\tilde{\theta})$. We then expand $\mathbb{E}[f_1(\tilde{\theta})]$ as $$f_1(\theta)^2 + \frac{f_1(\theta) f_{1ii}(\theta)}{t_1^2} + \frac{f_{1i}(\theta)^2}{t_1^2} + O((\tilde{\theta} - \theta)^3). \quad (16)$$

We may substitute Eq. (16) into Eq. (15) to obtain $$M = \frac{g_2(\theta)}{t_2^2} + \frac{g_3(\theta)}{t_1^2 t_2^2} + \frac{g_1(\theta)}{t_1^4} + O((\tilde{\theta} - \theta)^3), \quad (17)$$

where $g_2(\theta) = f_1(\theta)^2$ and $g_3(\theta)$ have been introduced to absorb more time-independent factors.

With regard to optimal time allocation, to complete the process, we specify how the total time $t_{total}$ is to be allocated between $t_1$ and $t_2$. We want to choose the $t_1$, $t_2$, under the constraint that $t_1 + t_2 = t_{total}$, which minimize the MSE $$M = \frac{g_2(\theta)}{t_2^2} + \frac{g_3(\theta)}{t_1^2 t_2^2} + \frac{g_1(\theta)}{t_1^4}. \quad (18)$$

The $g_1$, $g_2$, $g_3$ functions are only dependent on $\theta$ and not $t_1$, so we may set the derivative of M with respect to $t_1$ equal to 0 and obtain $$\frac{2g_2(\theta)}{t_2^3} + \frac{2g_3(\theta)}{t_2^3 t_1^2} = \frac{2g_3(\theta)}{t_2^2 t_1^3} + \frac{4g_1(\theta)}{t_1^5}. \quad (19)$$

Let $r = t_1/t_2$. Then we may rearrange to obtain $$g_2(\theta) t_1^2 = \frac{g_3(\theta)}{r} + \frac{2g_1(\theta)}{r^3} - g_3(\theta). \quad (20)$$

Since $t_1 \gg 1$, then $r \ll 1$, so the $r^{-3}$ term dominates the RHS.

Thus, $$g_2(\theta) t_1^2 \approx \frac{2g_3(\theta)}{r^3},$$

which implies $$t_1 \approx \left(\frac{2g_1(\theta)}{g_2(\theta)}\right)^{1/5} t_2^{3/5} \approx \left(\frac{2g_1(\theta)}{g_2(\theta)}\right)^{1/5} t_{total}^{3/5} \quad (21)$$

Therefore, the best possible allocation satisfies $$t_1 = g(\theta) t_{total}^{3/5}, \quad (22)$$

where g is a function which depends only on f and $\theta$. In particular, $t_1 = \mathcal{O}(t_{total}^{3/5})$, so the fraction of time spent on $t_1$ vanishes as $t_{total} \to \infty$. Almost all of the time is spent on $t_2$, the linear combination step of the two-step process. It can readily be shown that Eq. (17) is asymptotically dominated by the first term when this time allocation is chosen, which (since $t_2 \to t_{total}$) is equal to the right-hand-side of the bound in Eq. (8). In other words, this distribution of time asymptotically achieves the optimal MSE.

The two-step process exhibits Heisenberg scaling as defined for distributed sensing. Comparing Eq. (10) to Eq. (8) shows an improvement of O(d), maximized when all components of $\nabla f(\theta)$ are approximately equal. Intuitively, the advantage is maximal when all parameters contribute, but minimal (i.e. no advantage) when only one parameter affects the function value. Similar behavior was noted in the linear combination case.

Note that when actually implementing the process, the optimal $t_1$ is unknown since the function g that determines it depends on the true parameters $\theta$. However, we optionally do not use the optimal $t_1$ to saturate the bound in Eq. (8). If $t_1$ is a function $ct^p_{total}$ of the total time where $\frac{1}{2} < p < 1$ and some constant c, then the process will saturate Eq. (12). Suppose that $t_1 = ct^p_{total}$ for some $\frac{1}{2} < p < 1$ and sonic constant c. Since $p < 1$, we see that $$\lim_{t_{total} \to \infty} \frac{t_2}{t_{total}} = 1.$$

Therefore, we may substitute our $t_1$ into the MSE formula in Eq. (17) and simplify:

$$\lim_{t_{total} \to \infty} M = \lim_{t_{total} \to \infty} \frac{g_2(\theta)}{t^2} + \frac{g_3(\theta)}{c^2 t^{2+2p}} + \frac{g_1(\theta)}{c^4 t^{4p}}. \quad (23)$$

Since $p > \frac{1}{2}$, the $t^2_{total}$ term is dominant. Thus, as we defined $g_2 := f_1(\theta)^2 = \max_i f_i(\theta)^2$ under the assumption that $f_1(\theta)^2$ was maximal, our asymptotic error is $$M = \frac{\max_i f_i(\theta)^2}{t^2}, \quad (24)$$

which saturates the bound of Eq. (8). Although selecting a non-optimal time allocation does result in a higher MSE, the additional error is $O(t^{-4})$, which is insignificant asymptotically. The two-step process will therefore be asymptotically optimal for a wide range of time allocations.

With regard to function measurement in certain physical settings, consider a different physical setting for function estimation. Rather than d qubits which accumulate phase for some time t, we instead pass n photons through d Mach-Zehnder interferometers and accumulate some fixed phase $\theta_i$ encoded into each interferometer (see FIG. 4). For single parameters, the use of entangled states to reduce noise in this setting has been explored with multiparameter cases. In this setting, the relevant limitation is the total number of photons used in the measurement, rather than time. This constraint is particularly relevant when analyzing a biological or chemical sample which is sensitive to light, making it desirable to reduce noise with as few photons as possible. Similar biologically motivated situations are contemplated.

For photons, a two-step process with similar structure to the process for qubits yields reduced noise compared to any estimate of f derived entirely from local measurements. Suppose we allot $N_1$ photons for the first step (individual measurement) and $N_2$ photons for the second step (linear combination), for a total of $N_{total}=N_1+N_2$ photons. We again begin from the general result of Eq. (12). However, the use of photons which can be apportioned between modes introduces new structure to the problem. We need to partition the $N_1$ photons into $N_1=n_1+\ldots n_d$, putting $n_i$ photons into the i-th interferometer, as some parameters may affect our final result more than others. Thus, in the second term of Eq. (12), we replace $\text{Var}\hat{\theta}_i$ with $$\frac{1}{n_1^2}$$

instead of $$\frac{1}{t_1^2}.$$

The optimal variance when measuring the linear combination $\alpha\cdot\theta$ using N total photons is unknown. However, the optimal variance is conjectured to be $$\text{Var}\,\widehat{\alpha\cdot\theta} \geq \frac{\|\alpha\|_1^2}{N^2} \qquad (25)$$

Figure 4:
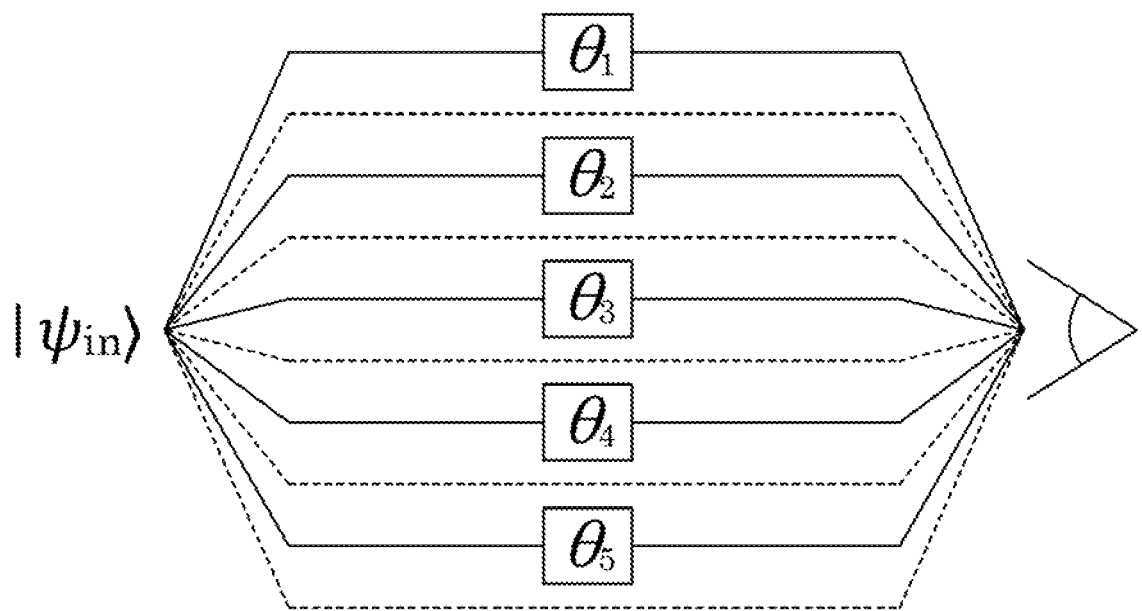
FIG. 4 shows a physical system including a quantum sensor network of separate interferometers, wherein in each interferometer, an arm accumulates an unknown phase $\theta_i$ and the other arm is a reference port with no phase.
Figure 5:
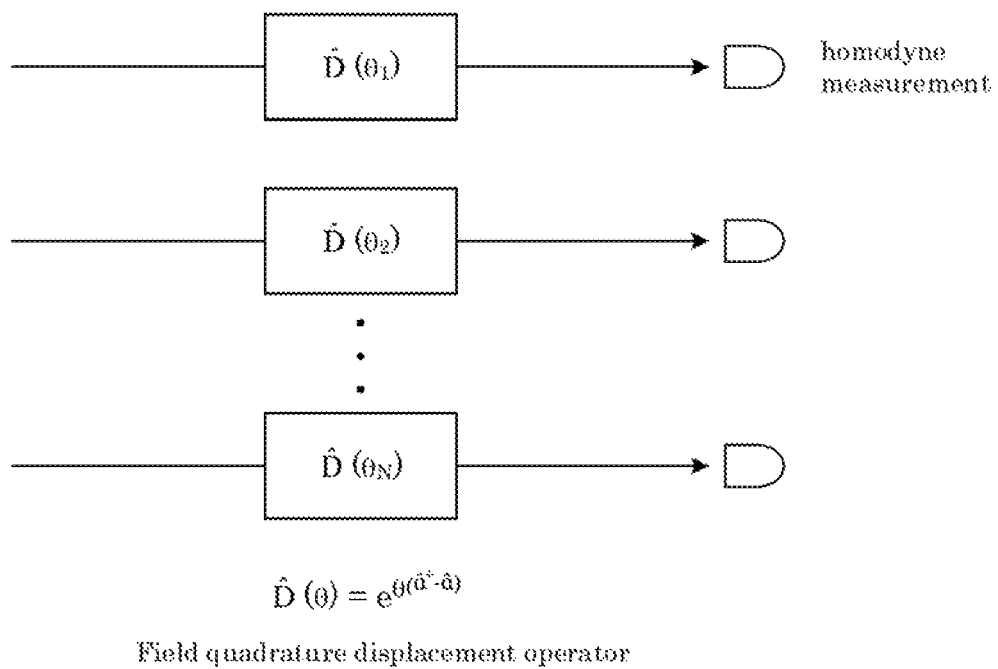
FIG. 5 shows a physical system including a quantum sensor network of field-quadrature displacement sensors, wherein each sensor includes a field mode that experiences a displacement by a real field quadrature $\theta_i$, as well as a homodyne detector that measures this real quadrature.

Furthermore, achieving the bound in Eq. (25) involves a proportionally weighted GHZ state:

$$|\psi_{photon}\rangle = \frac{1}{\sqrt{2}}(|n_1, 0, n_2, 0 \ldots\rangle + |0, n_1, 0, n_2, \ldots\rangle),$$

where $$n_i = N_{total}\frac{\alpha_i}{\sum \alpha_j}$$

and where, in reference to FIG. 4, the modes are listed from top to bottom. Note that this will only work for $\alpha$ proportional to some rational vector as photons are discrete. Since Eq. (25) is saturable, we may simplify the first term of Eq. (12) to obtain $$M = \frac{\mathbb{E}[\|\nabla f(\theta)\|_1^2]}{N_2^2} + \frac{2f_{ij}(\theta)^2 + \frac{f_{ii}(\theta)f_{jj}(\theta)}{4}}{n_i^2 n_j^2} \qquad (26)$$

For fixed f and $\theta$, the $$\frac{1}{n_i n_j}$$

terms in Eq. (26) are minimized for the same ratio of $n_1:n_2:\ldots:n_d$ regardless of the value of the total number of photons used, $N_1$. Each term is proportional to $N_1^{-4}$ multiplied by some function of f, $\theta$, and d. Therefore, the structure of Eq. (26) becomes identical to the structure of Eq. (17), with $N_1$ and $N_2$ replacing $t_1$ and $t_2$. As a result, the optimal allocation of photons between $N_1$ and $N_2$ will yield $N_1=O(N_{total}^{3/5})$ and $N_2=O(N_{total})$, meaning that the $N_2^{-2}$ term in Eq. (26) is dominant asymptotically. Therefore, for photons, we may asymptotically achieve $$M = \frac{\|\nabla f(\theta)\|_1^2}{N_2^2} + O\left(\frac{1}{N_{total}^{12/5}}\right) \qquad (27)$$

This strategy is optimal if the linear combination estimation strategy is optimal. Our optimality result remains true for spins evolving under Eq. (1) and for photons that our process is conjectured to be optimal.

Eq. (27) also exhibits Heisenberg scaling. Suppose we were to measure each parameter individually and then calculate the function. When measuring the parameters individually, we obtain the same error formula as Eq. (9), except now we set $$\hat{\theta}_i = \frac{1}{n_i^2}$$

Var to get $$M_{unentangled} = \frac{f_i(\theta)^2}{n_i^2}. \qquad (28)$$

The optimal distribution requires an m proportional to the weight $f_i(\theta)^{2/3}$, yielding an entanglement-free error of $$M_{unentangled} = \frac{\|\nabla f(\theta)\|_{2/3}^2}{N^2}. \qquad (29)$$

As with qubits, by comparing Eq. (27) with Eq. (29) in the case where all of the $f_i(\theta)$ are approximately equal, we find that the photonic two-step process yields a O(d) improvement in error over measuring each parameter individually. This improvement when all quantities are equally important can be seen for the special case of f being a linear combination. As in the qubit case, the improvement in error is lessened when $\nabla f(\theta)$ is not approximately equal in all components.

This method can be extended still more generally. Rather than cases where the signal is imprinted on photons by a phase shift, we can consider entanglement-enhanced distributed sensing of continuous variables by using homodyne measurements. Besides measuring parameters in different physical settings, we may also measure functions of variables coupled to spins, phase-shifts of photons, continuous variables, and any combination of these. In such a hybrid scenario, we can still make use of the two-step process. The first step, obtaining initial estimates for the individual parameters, proceeds equivalently, since the measurements of the spins and of the photons can be viewed as occurring in parallel. For the linear combination case, we can assume that the optimal spin and photon input states can be entangled as follows:

$$|\psi_{spin-photon}\rangle = \frac{1}{\sqrt{2}}(|n_1, 0, n_2, 0 \ldots \rangle \otimes |\rangle +$$
$$|1, 1, 1, \ldots \rangle \otimes |0, n\_1, 0, n\_2, \ldots \rangle \otimes |0, 0, 0, \ldots \rangle)$$

Here, $$n_i = N_{total} \frac{\alpha_i}{\sum \alpha_j},$$

where the sum runs over only the j corresponding to photonic modes, denotes the number of photons which pass through the arms of the i-th interferometer. The state in Eq. (30) is designed in such a way that the two branches of the overall wavefunction accumulate relative to each other a phase equal to the total linear combination we are interested in. In order to extract this final phase, the state can be unitarily mapped onto a qubit, which contains all of the accumulated phase and is then measured.

The linear combination process can accumulate phase proportional to time for the qubits and phase proportional to the number of photons for interferometers. For instance, if $\theta_1$ is coupled to a qubit (and therefore has units of frequency) and $\theta_2$ is coupled to an interferometer (and is therefore unitless), then the two branches of our state accumulate a relative phase $\theta_1 f + \theta_2 n$. Therefore, one may have to adjust t or n in order to get the desired linear combination.

With regard to application, the process estimates an analytic function of the inputs in a variety of potential applications. When sensors are processed into a single signal, the process provides enhanced sensitivity using entanglement. There is no requirement that different $\theta_1$ have the same physical origin. For instance, a $\theta_1$ representing an electric field and $\theta_2$ measuring a magnetic field could be used to measure the Poynting vector.

One potential application of function measurements is the interpolation of non-linear functions. Suppose that an ansatz with d tunable parameters is made for the strength of the field in a region. With readings from ≤d different points, one could determine the parameters of the ansatz and therefore determine the value of the field at other points. Estimations of these ansatz parameters, which are functions of the measured fields, may potentially be improved using entangled states depending on the figure of merit. Note that this procedure, can be carried out even if it is difficult to invert the ausatz in terms of the d measurements. Suppose that $\theta = f(c, x)$ and that $c = f^1(\theta, x)$ exists, but has no closed-form solution which can be easily evaluated. First, we make measurements $\tilde{\theta}$. To create an initial estimate of the values c, we use a numerical root-finder to find estimates $\tilde{c}$. We can now implement the second step of our process by finding the first derivatives $\partial c_i / \partial \theta_j$ using the matrix identity $$\frac{\partial \theta}{\partial c} \cdot \frac{\partial c}{\partial \theta} = I.$$

Since f is known, $\partial \theta / \partial c$ can be inverted to yield the $\partial c / \partial \theta$ needed to estimate $\tilde{q} = \partial c / \partial \theta|_{\theta = \tilde{\theta}} \cdot (\theta - \tilde{\theta})$. Our final estimate is $\tilde{c} + \tilde{q}$, which was obtained without having to compute $f^{-1}$ in general.

Interpolation in this manner can proceed by two different schemes. Measure the ansatz parameters themselves, which provides computation of the field at all other points or skip the final computation step by writing the field at a point of interest as a function of all the points that can be measured. This final function can be directly measured using an entangled process, which will be more accurate. The first approach has the advantage that knowing the ansatz parameters provides estimation of all points in the space in question.

One particular interpolation of interest arises in ion trap quantum computing. In trapped ion chains, qubits are manipulated using Gaussian laser beams, and two primary sources of error are intensity and beam pointing fluctuations. Our process offers better ways to characterize this noise. In order to detect the field error at a qubit's position without disturbing the qubit, we can perform interpolation by measuring the field's effect on other ions, possibly of a different atomic species, positioned nearby. Given the ansatz of the Gaussian beam profile, we are able to calculate the field at the qubit of interest and perhaps correct the error. As entanglement of ions is already a functionality for trapped ion quantum computers, our process is applicable in that domain.

The Heisenberg-scaling measurement process includes quantum sensor networks for measuring any multivariate, real-valued, analytic function, and this process is consistent with the Heisenberg limit when measuring functions with comparably-sized gradients in each component. Recent advances in the distribution of entanglement, for instance, in satellites distributing entangled photons more than 1000 km, strengthen the viability of this scheme over large distances in the near-term. Potential sensing platforms include trapped ions and nitrogen vacancy defects in diamond, which can also be entangled and are proven platforms for magnetometry and thermometry. Optimality of the two-step process when constrained by the number of photons is contemplated and extends results into quantum networking to explore how entanglement can be reliably distributed for metrological purposes.

Field interpolation can be made, and the process can provide measurement of any analytic function.

For derivation of Eq. 12, let $\Delta = \tilde{\theta} - \theta$ which satisfies $E[\Delta] = 0$. Furthermore, let $T_k$ be k! times the k-th term of the Taylor expansion of f (so $T_1 = f_i(\theta) \Delta_i$, $T_2 = f_{ij}(\theta) \Delta_i \Delta_j$, $T_3 = f_{ijk}(\theta) \Delta_i \Delta_j \Delta_k$, etc.). Thus, the Taylor expansion of $f(\tilde{\theta})$ would be $$f(\tilde{\theta}) = f(\theta) + T_1 + \frac{T_2}{2} + \frac{T_3}{6} + \ldots \quad (A1)$$

We compute our figure of merit:

$$M = \mathbb{E}\left[\left(f(\tilde{\theta}) + \tilde{q} - f(\theta)\right)^2\right] \quad (A2)$$

$$M = \mathbb{E}\left[\left(f(\tilde{\theta}) - f(\theta)\right)^2\right] + \mathbb{E}[\tilde{q}^2] + 2\mathbb{E}\left[f(\tilde{\theta})q\right] - 2f(\theta)\mathbb{E}[\tilde{q}] \quad (A3)$$

term 1 term 2 term 3 = (A4)

$$\underbrace{\mathbb{E}[T_1^2] + \mathbb{E}[T_1 T_2] + \frac{1}{3}\mathbb{E}[T_1 T_3] + \frac{1}{4}\mathbb{E}[T_2^2] + O(\Delta^5)}_{\text{term 1}} +$$

$$\underbrace{\mathbb{E}[\text{Var}_{\tilde{q}}\tilde{q}] + \mathbb{E}[q^2]}_{\text{term 2}} +$$

$$\underbrace{2f(\theta)\mathbb{E}[q] + \mathbb{E}[T_1 q] + \frac{1}{2}\mathbb{E}[T_2 q] + \frac{1}{6}\mathbb{E}[T_3 q] + O(\Delta^5) - 2f(\theta)\mathbb{E}[q]}_{\text{term 3}}$$

$$= \mathbb{E}[\text{Var}_{\tilde{q}}\tilde{q}] + \mathbb{E}[(q+T_1)^2] + \quad (A5)$$

$$\mathbb{E}[(q+T_1)T_2] + \frac{1}{3}\mathbb{E}[(q+T_1)T_3] + \frac{1}{4}\mathbb{E}[T_2^2] + O(\Delta^5).$$

We may simplify $$q + T_1 = \Delta_i(f_i(\theta) - f_i(\tilde{\theta})) \quad (A6)$$

$$= -\Delta_i(f_{ij}(\theta)\Delta_j + O(\Delta^2)) \quad (A7)$$

$$= -T_2 + O(\Delta^3)$$

So Eq (5) evaluates to $$M = \mathbb{E}[\text{Var}_{\tilde{q}}\tilde{q}] + \mathbb{E}[T_2^2] - \mathbb{E}[T_2^2] - \frac{1}{3}\mathbb{E}[T_2 T_3] + \frac{1}{4}\mathbb{E}[T_2^2] + O(\Delta^5)$$

$$= \mathbb{E}[\text{Var}_{\tilde{q}}\tilde{q}] + \frac{1}{4}\mathbb{E}[T_2^2] + O(\Delta^5)$$

$$M = \mathbb{E}[\text{Var}_{\tilde{q}}\tilde{q}] + \frac{1}{4}\mathbb{E}[T_2^2]$$

$$= \mathbb{E}[\text{Var}_{\tilde{q}}\tilde{q}] + \frac{1}{4}\mathbb{E}[(f_{ij}(\theta)\Delta_i\Delta_j)^2]$$

$$= \mathbb{E}[\text{Var}_{\tilde{q}}\tilde{q}] + \frac{1}{4}\mathbb{E}\left[4\sum_{i<j} f_{ij}(\theta)^2 \Delta_i^2 \Delta_j^2 + 2\sum_{i<j} f_{ii}(\theta)f_{jj}(\theta)\Delta_i^2\Delta_j^2 + \sum_i f_{ii}(\theta)^2 \Delta_i^4\right]$$

since $\mathbb{E}[T_2 T_3]$ is $O(\Delta^5)$. Now, this simplifies further as (A11)(A12)(A13)

since all terms with some $\Delta_i$ to a single power will factor out as $\mathbb{E}[\Delta_i]=0$. We will assume that $\Delta_i \sim \mathcal{N}(0, t^{-2})$ is normally distributed. This is optional when the distribution of errors satisfies $\mathbb{E}[\Delta_i^4] \leq O(t_i^{-4})$, a condition that is satisfied by phase estimation procedures. However, assuming normality allows the calculation to proceed easily, as we will be able to simplify $\mathbb{E}[\Delta_i^4] = 3 \text{Var } \widetilde{\theta_i^2}$. Thus, we arrive at $$M = \mathbb{E}[\text{Var}_{\tilde{q}}\tilde{q}] + \frac{1}{4}\left(4\sum_{i<j} f_{ij}(\theta)^2 \text{Var}\tilde{\theta}_i \text{Var}\tilde{\theta}_j + \right. \quad (A14)$$

$$\left. 2\sum_{i<j} f_{ii}(\theta)f_{jj}(\theta)\text{Var}\tilde{\theta}_i\text{Var}\tilde{\theta}_j + \sum_i 3f_{ii}(\theta)^2 \text{Var}\tilde{\theta}_i^2\right)$$

$$= \mathbb{E}[\text{Var}_{\tilde{q}}\tilde{q}] + \sum_{i,j} \frac{2f_{ij}(\theta) + f_{ii}(\theta)f_{jj}(\theta)}{4} \text{Var}\tilde{\theta}_i \text{Var}\tilde{\theta}_j. \quad (A15)$$

Here, we present simplification of the labeled terms from Eqs.(A3-A5). Term 2 is simplified by using the definition of $\text{Var}_{\tilde{q}}\tilde{q}$. One needs to be careful as there are two layers of expected values—one for the values of $\tilde{\theta}$ and one for the estimator $\tilde{q}$:

$$\mathbb{E}[\tilde{q}^2] = \mathbb{E}_{\tilde{\theta}}[\mathbb{E}_{\tilde{q}}[q^2]] \quad (A16)$$

$$= \mathbb{E}_{\tilde{\theta}}[\text{Var}_{\tilde{q}}\tilde{q} + \mathbb{E}_{\tilde{q}}[\tilde{q}]^2] \quad (A17)$$

$$= \mathbb{E}_{\tilde{\theta}}[\text{Var}_{\tilde{q}}\tilde{q} + q^2] \quad (A18)$$

$$= \mathbb{E}_{\tilde{\theta}}[\text{Var}_{\tilde{q}}\tilde{q}] + \mathbb{E}[q^2] \quad (A19)$$

Terms 1 and 3 are simplified by expanding the Taylor series for $f(\tilde{\theta})$ up to $\Delta^4$ terms; note that $q=O(\Delta)$, so we only need to expand the Taylor series up to $O(\Delta^3)$ terms:

$$\underbrace{\mathbb{E}\left[\left(f(\tilde{\theta}) - f(\theta)\right)^2\right]}_{\text{term 1}} = \mathbb{E}[f(\tilde{\theta})^2] - 2f(\theta)\mathbb{E}[f(\tilde{\theta})] + f(\theta)^2 \quad (A20)$$

$$= f(\theta)^2 + \mathbb{E}[T_1^2] + f(\theta)\mathbb{E}[T_2] + \mathbb{E}[T_1 T_2] + \quad (A21)$$

$$\frac{1}{3}f(\theta)\mathbb{E}[T_3] + \frac{1}{12}(\theta)\mathbb{E}[T_4] + \frac{1}{3}\mathbb{E}[T_1 T_3] + \frac{1}{4}\mathbb{E}[T_2^2] + O(\Delta^5)$$

$$-2f(\theta)\left(f(\theta) + \frac{1}{2}\mathbb{E}[T_2] + \frac{1}{6}\mathbb{E}[T_3] + \frac{1}{24}\mathbb{E}[T_4] + O(\Delta^5)\right) + f(\theta)^2 = \quad (A22)$$

$$\mathbb{E}[T_1^2] + \mathbb{E}[T_1 T_2] + \frac{1}{3}\mathbb{E}[T_1 T_3] + \frac{1}{4}\mathbb{E}[T_2^2] + O(\Delta^5).$$

$$\underbrace{\mathbb{E}[f(\tilde{\theta})\tilde{q}]}_{\text{term 1}} = \mathbb{E}_{\tilde{\theta}}[\mathbb{E}_{\tilde{q}}]f(\tilde{\theta})\tilde{q} \quad (A23)$$

$$= \mathbb{E}_{\tilde{\theta}}[f(\tilde{\theta})q] \quad (A24)$$

$$= \mathbb{E}\left[\left(f(\theta) + T_1 + \frac{T_2}{2} + \frac{T_3}{6} + O(\Delta^4)\right)q\right] \quad (A25)$$

$$= f(\theta)\mathbb{E}[q] + \mathbb{E}[T_1 q] + \frac{\mathbb{E}[T_2 q]}{2} + \frac{\mathbb{E}[T_3 q]}{6} + O(\Delta^5) \quad (A26)$$

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity), The conjunction "or" is used to link objects of a list or alternatives and is not disjunctive; rather the elements can be used separately or can be combined together under appropriate circumstances.

What is claimed is:

1. A process for determining a physical scalar of an arbitrary response function, the process comprising:
   providing the arbitrary response function that comprises a plurality of action parameters θi;
   subjecting a physical system that comprises a plurality of quantum sensors to a physical stimulus;
   producing, for an action parameter of each quantum sensors, in response to subjecting the quantum sensors to the physical stimulus, a measured action parameter to provide a plurality of measured action parameters for the physical system;
   producing a zeroth-order value of the arbitrary response function by evaluating the arbitrary response function at the measured action parameters;
   determining the gradient of the arbitrary response function at the measured action parameters;
   producing an perturbation pulse;
   subjecting the physical system to the perturbation pulse;
   producing, in response to the perturbation pulse, modal amplitude comprising a measured value of a dot product of the gradient and a vector of action parameters θi;
   producing a first-order value of the arbitrary response function by subtracting from modal amplitude the dot product of the gradient and the vector of measured action parameter; and
   adding the zeroth-order value and the first-order value to determine the physical scalar of the arbitrary response function.

2. A Heisenberg scaler for reducing noise in quantum metrology, the Heisenberg scaler comprising:
   a stimulus source that provides a first physical stimulus and a second physical stimulus;
   a physical system in communication with the stimulus source and comprising a plurality of quantum sensors and that:
      receives the first physical stimulus and the second physical stimulus from the stimulus source;
      produces measured action parameter in response to receipt of the first physical stimulus;
      receives an perturbation pulse from a sensor interrogation unit;
      produces modal amplitude;
   an estimation machine in communication with the physical system and that:
      receives the measured action parameter from the physical system; and
      produces a zeroth-order value from the measured action parameter;
   a gradient analyzer in communication with the physical system and the sensor interrogation unit and that:
      receives the measured action parameter from the physical system; and
      produces the measured action parameter and a gradient from the measured action parameter;
   the sensor interrogation unit in communication with the physical system and the gradient analyzer and that:
      receives the modal amplitude from the physical system;
      receives the gradient and the measured action parameter from the gradient analyzer;
      produces the perturbation pulse; and
      produces a first-order value from the modal amplitude, the gradient, and the measured action parameter; and
   a Heisenberg determination machine in communication with the estimation machine and the sensor interrogation unit and that:
      receives the zeroth-order value from the estimation machine;
      receives the first-order value from the sensor interrogation unit; and
      produces a physical scalar from the zeroth-order value and the first-order value.

* * * * *